(12) United States Patent
Anderson et al.

(10) Patent No.: US 10,529,628 B2
(45) Date of Patent: Jan. 7, 2020

(54) SEMICONDUCTOR DEVICE AND METHOD OF FORMING THE SEMICONDUCTOR DEVICE

(71) Applicant: International Business Machines Corporation, Armonk, NY (US)

(72) Inventors: Brent Alan Anderson, Jericho, VT (US); Ruqiang Bao, Wappingers Falls, NY (US); Paul Charles Jamison, Hopewell Junction, NY (US); ChoongHyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/050,873

(22) Filed: Jul. 31, 2018

(65) Prior Publication Data

US 2018/0350698 A1    Dec. 6, 2018

Related U.S. Application Data

(62) Division of application No. 15/279,148, filed on Sep. 28, 2016, now Pat. No. 10,134,642.

(51) Int. Cl.
| | |
|---|---|
| *H01L 21/8238* | (2006.01) |
| *H01L 27/092* | (2006.01) |
| *H01L 29/49* | (2006.01) |
| *H01L 29/78* | (2006.01) |
| *H01L 29/66* | (2006.01) |
| *H01L 29/786* | (2006.01) |
| *H01L 29/423* | (2006.01) |
| *H01L 21/28* | (2006.01) |

(52) U.S. Cl.
CPC ........... *H01L 21/823842* (2013.01); *H01L 21/823885* (2013.01); *H01L 27/092* (2013.01); *H01L 29/42376* (2013.01); *H01L 29/42392* (2013.01); *H01L 29/4908* (2013.01); *H01L 29/66545* (2013.01); *H01L 29/66666* (2013.01); *H01L 29/785* (2013.01); *H01L 29/7827* (2013.01); *H01L 29/78642* (2013.01); *H01L 21/28088* (2013.01)

(58) Field of Classification Search
None
See application file for complete search history.

(56) References Cited

U.S. PATENT DOCUMENTS

| | | | |
|---|---|---|---|
| 7,405,127 B2 | 7/2008 | Tews | |
| 7,736,965 B2 | 6/2010 | Cheng et al. | |
| 8,481,410 B1 | 7/2013 | LiCausi et al. | |
| 8,617,952 B2 | 12/2013 | Kim et al. | |
| 9,397,003 B1 * | 7/2016 | Niimi | H01L 21/823418 |
| 10,134,642 B2 * | 11/2018 | Anderson | H01L 21/823842 |
| 2005/0079706 A1 | 4/2005 | Kumar | |

(Continued)

*Primary Examiner* — Charles D Garber
*Assistant Examiner* — Xiaoming Liu
(74) *Attorney, Agent, or Firm* — Vazken Alexanian; McGinn IP Law Group, PLLC

(57) ABSTRACT

A semiconductor device includes an n-type field effect transistor (nFET) including a first fin and a first metal gate formed on the first fin, and a p-type field effect transistor (pFET) including a second fin and a second metal gate formed on the second fin, a thickness of the second metal gate being substantially the same as a thickness of the first metal gate.

20 Claims, 31 Drawing Sheets

(56) References Cited

U.S. PATENT DOCUMENTS

2015/0287675 A1* 10/2015 Shaviv ................ H01L 23/5226
                                                    257/774
2015/0380539 A1    12/2015 Colinge et al.
2016/0087059 A1     3/2016 Hsieh et al.
2016/0133632 A1*  5/2016 Park ................ H01L 21/823828
                                                    257/369

* cited by examiner

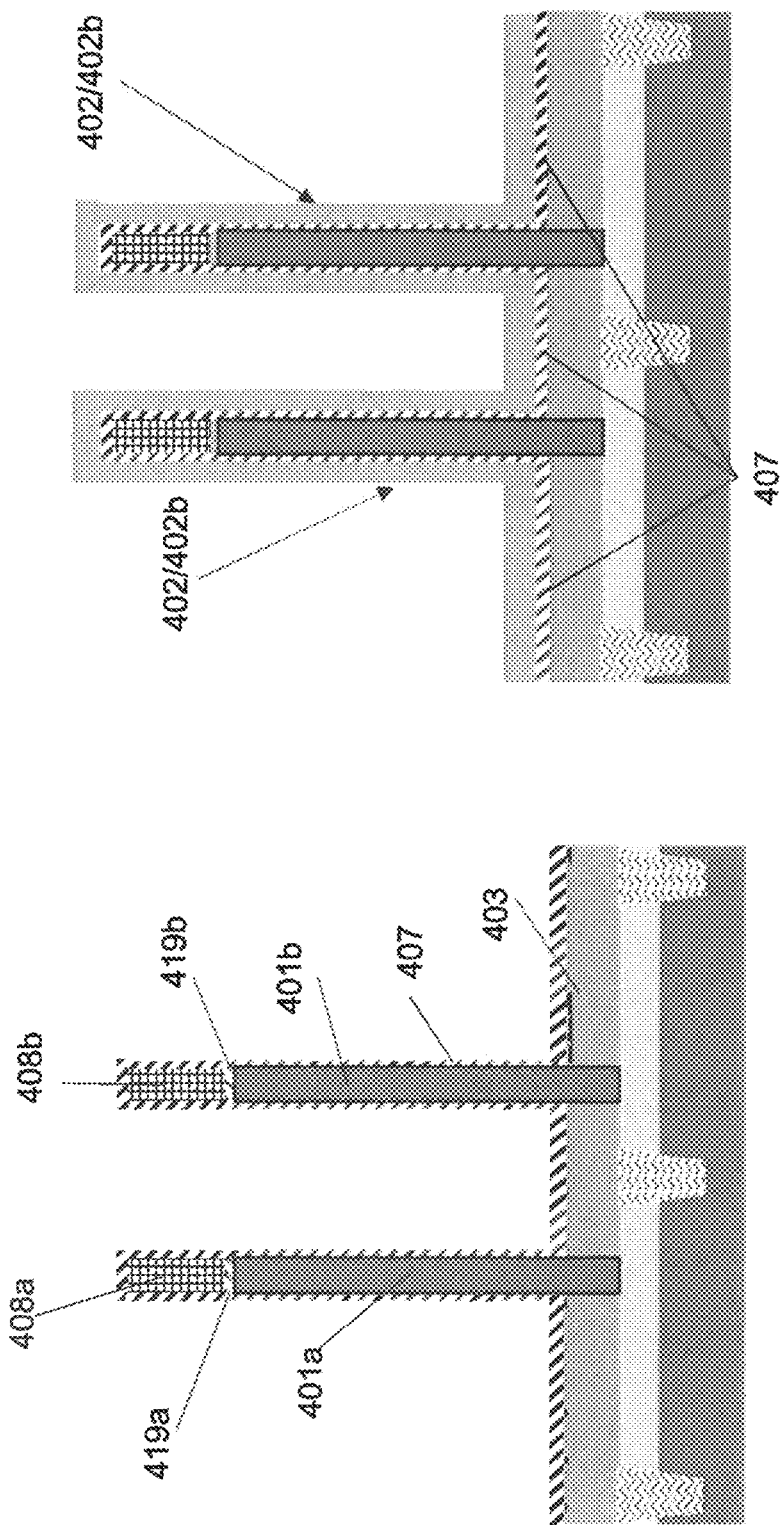

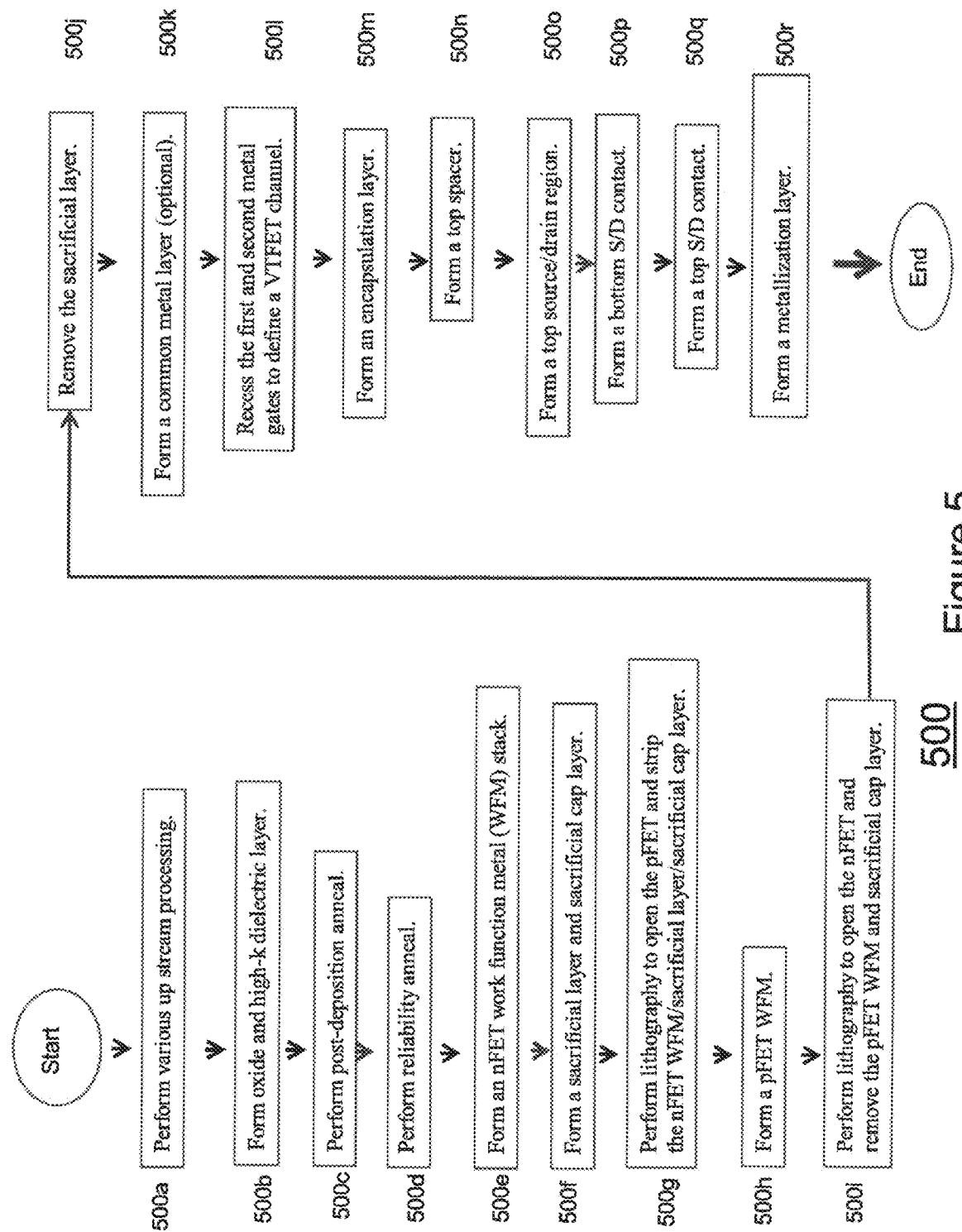

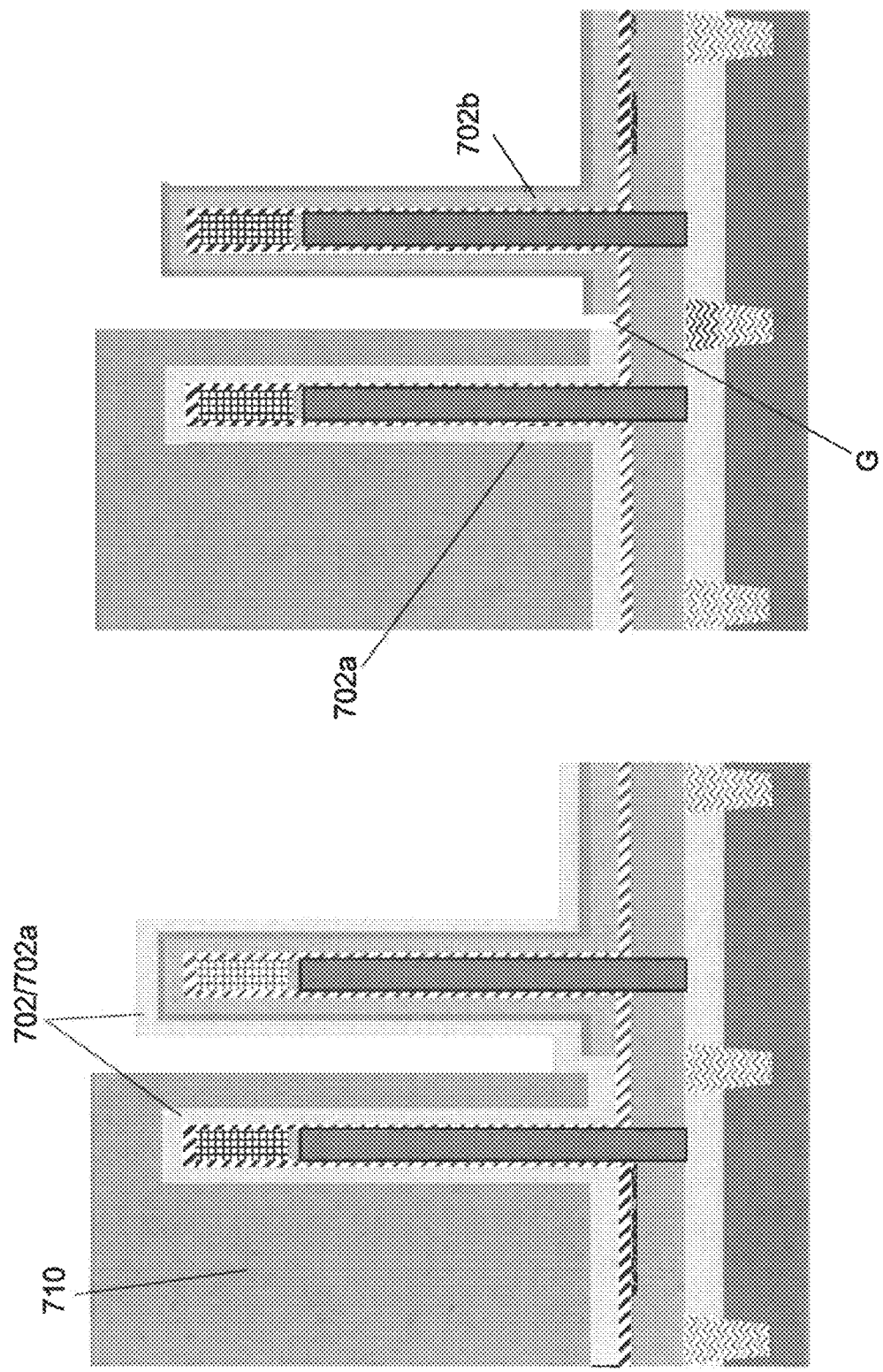

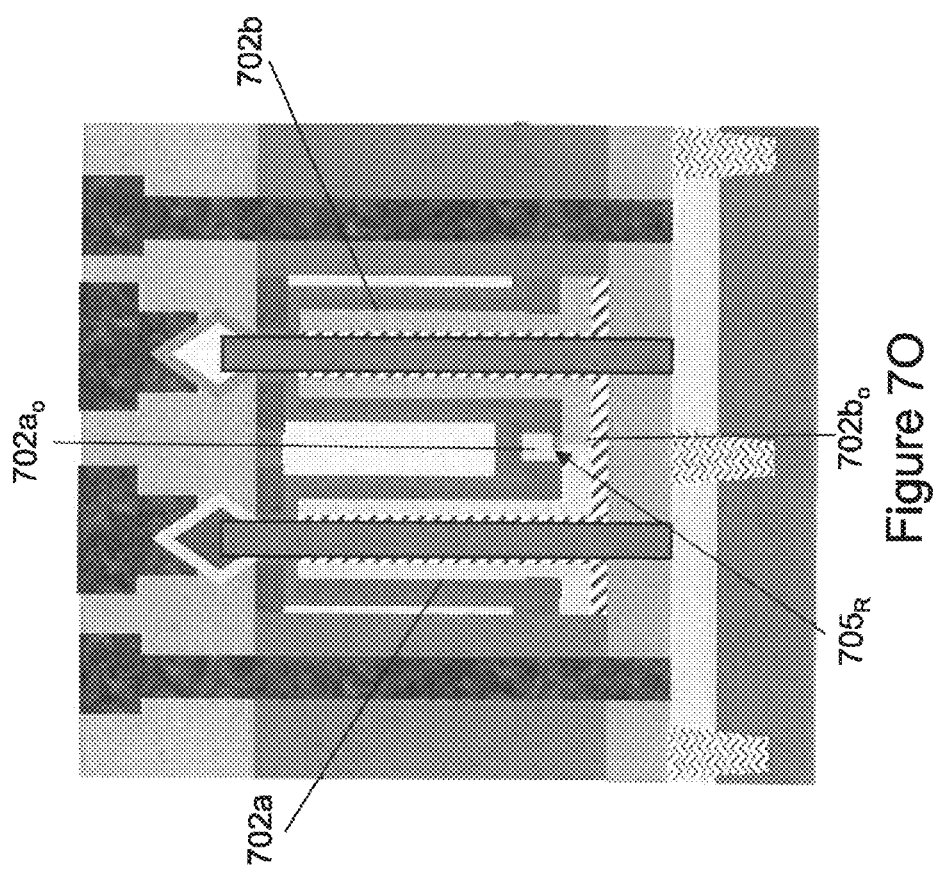

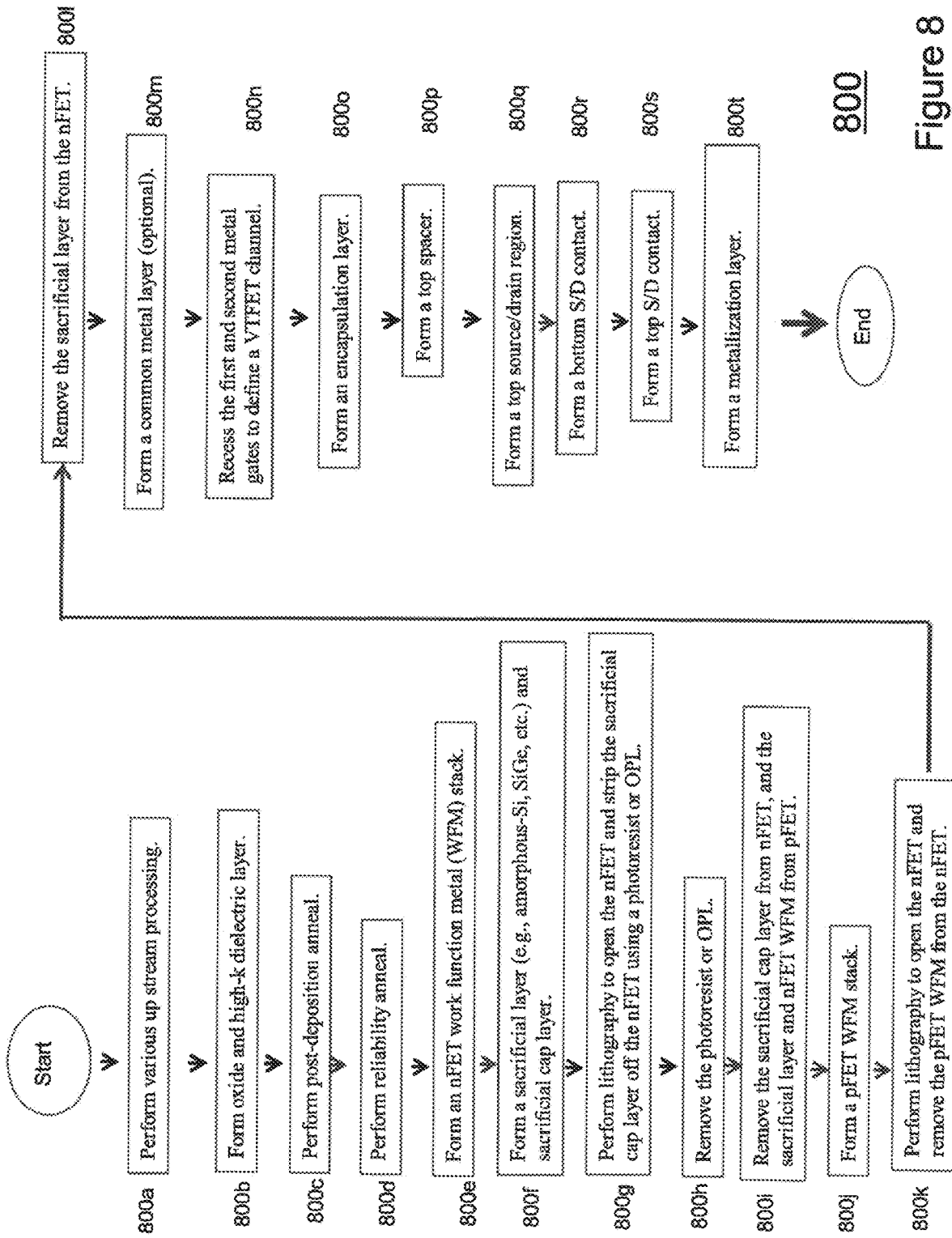

SEMICONDUCTOR DEVICE AND METHOD OF FORMING THE SEMICONDUCTOR DEVICE

The present Application is a Divisional Application of U.S. patent application Ser. No. 15/279,148, which was filed on Sep. 28, 2016.

BACKGROUND

The present invention relates generally to a semiconductor device and method of forming the semiconductor device, and more particularly, a semiconductor device in which a thickness of a metal gate of an nFET is substantially the same as a thickness of a metal gate of the pFET.

High-k metal gate (HKMG) technology incorporates a high-k dielectric, and a metal gate instead of a polysilicon gate. HKMG technology reduces gate leakage, thereby increasing the transistor capacitance and allowing chips to function with reduced power needs.

A related art semiconductor device (e.g., a complementary metal oxide semiconductor (CMOS) device) includes vertical transport field-effect transistors (VTFETs) which utilize HKMG technology. The VTFETs include a bottom source/drain (S/D), a semiconductor fin formed on the bottom S/D, a metal gate formed on a side of the fin, and a high-k dielectric formed between the fin and the metal gate.

SUMMARY

An exemplary aspect of the present invention is directed to a method of forming a semiconductor device. The method includes forming a first work function metal and sacrificial layer on an n-type field effect transistor (nFET) and on a p-type field effect transistor (pFET), removing the sacrificial layer and the first work function metal from one of the nFET and the pFET, forming a second work function metal on the one of the nFET and the pFET, a thickness of the second work function metal being substantially the same as a thickness of the first work function metal, and removing the sacrificial layer from the other of the nFET and the pFET.

Another exemplary aspect of the present invention is directed to a semiconductor device. The device includes an n-type field effect transistor (nFET) including a first fin and a first metal gate formed on the first fin, and a p-type field effect transistor (pFET) including a second fin and a second metal gate formed on the second fin, a thickness of the second metal gate being substantially the same as a thickness of the first metal gate.

Another exemplary aspect of the present invention is directed to a method of forming a semiconductor device. The method includes forming a high-k dielectric layer on a fin of an n-type field effect transistor (nFET) and on a fin of a p-type field effect transistor (pFET), forming a first work function metal and sacrificial layer on the high-k dielectric layer on the fin of the nFET and the fin of the pFET, masking one of the nFET and the pFET, removing the sacrificial layer and the first work function metal from the other of the nFET and the pFET, forming a second work function metal on the nFET and the pFET, a thickness of the second work function metal being substantially the same as a thickness of the first work function metal, masking the other of the nFET and the pFET, and removing the second work function metal and the sacrificial layer on the one of the nFET and the pFET.

With its unique and novel features, the exemplary aspects of the present invention may provide a semiconductor device in which a thickness of a metal gate of an nFET is substantially the same as a thickness of a metal gate of the pFET.

BRIEF DESCRIPTION OF THE DRAWINGS

The exemplary aspects of the present invention will be better understood from the following detailed description of the exemplary embodiments of the invention with reference to the drawings, in which:

FIG. 4A illustrates (e.g., after performing a reliability strip) the forming of a high-k layer 407 (e.g., HfO$_2$, etc.) on the bottom spacer 403 (e.g., SiO$_2$, SiN, etc.), the fins 401a, 401b, the oxide layer 419a, 419b (e.g., SiO$_2$), and the hard mask (e.g., SiN) 408a, 408b, according to an exemplary aspect of the present invention.

FIG. 4B illustrates the forming of the pFET WFM 402/402b (e.g., TiN) (e.g., which becomes the metal gate 402b of the pFET) on the high-k dielectric layer 407, according to an exemplary aspect of the present invention.

FIG. 5 is a flow chart for a method 500 of forming a semiconductor device having nFET first pattern (underlapped or overlapped), according to another exemplary aspect of the present invention.

FIGS. 7A-7O illustrate a method 700 of forming a semiconductor device with a pFET-first underlapped pattern, according to another exemplary aspect of the present invention.

FIG. 7I illustrates the forming a mask 710 on the nFET, according to an exemplary aspect of the present invention.

FIG. 7J illustrates the removing (e.g., stripping, etching away etc.) of the nFET WFM 702/702a on the pFET, according to an exemplary aspect of the present invention.

FIG. 7O illustrates a semiconductor device 750 having a pFET-first, overlapped pattern, according to an exemplary aspect of the present invention.

FIG. 8 is a flow chart for a method 800 of forming a semiconductor device having an nFET first pattern (underlapped or overlapped), according to another exemplary aspect of the present invention.

DETAILED DESCRIPTION

Figure 1:
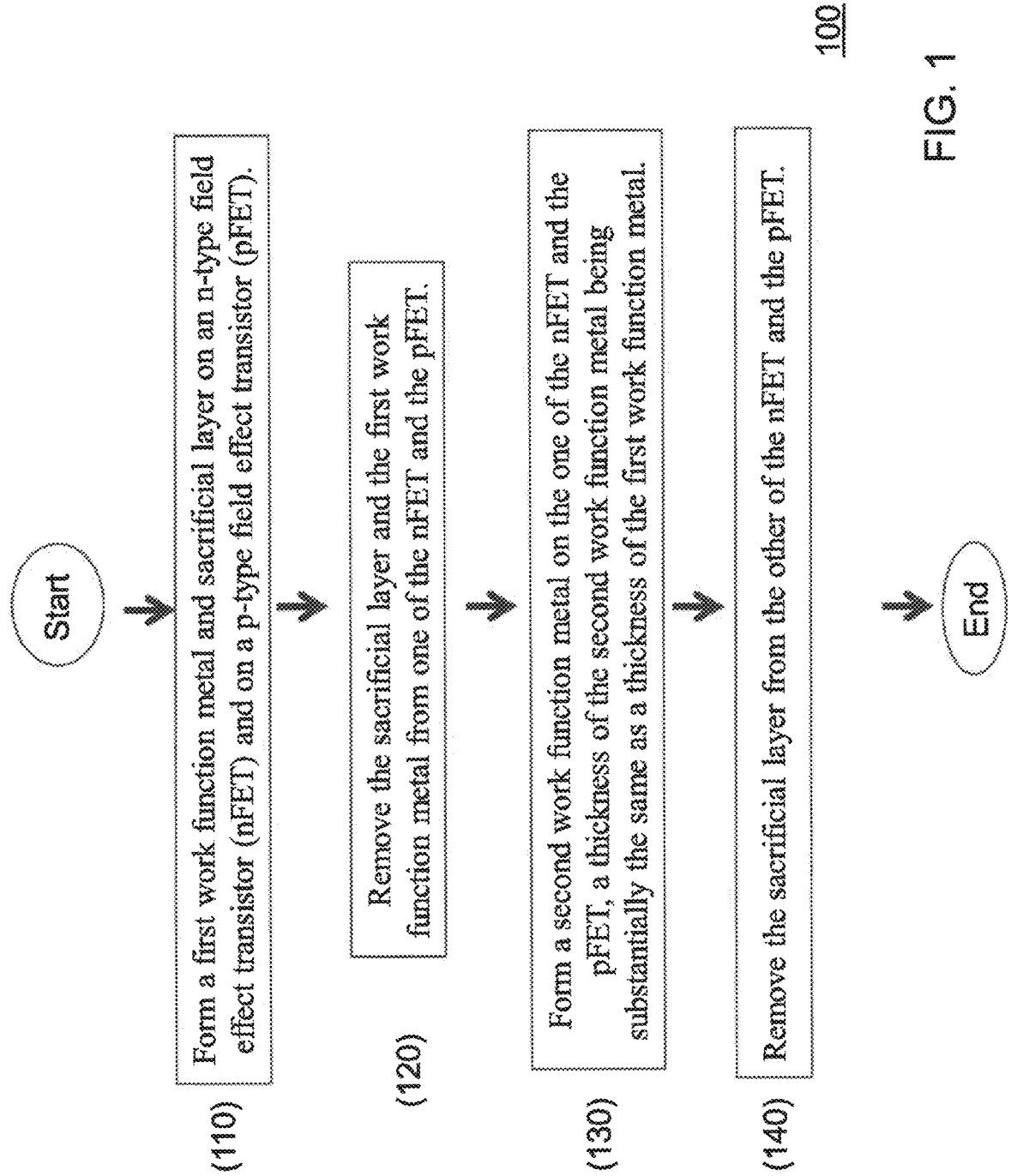
FIG. 1 illustrates a method 100 of forming a semiconductor device, according to an exemplary aspect of the present invention.

The invention will now be described with reference to FIGS. 1-11, in which like reference numerals refer to like parts throughout. It is emphasized that, according to common practice, the various features of the drawing are not necessarily to scale. On the contrary, the dimensions of the various features can be arbitrarily expanded or reduced for clarity. Exemplary embodiments are provided below for illustration purposes and do not limit the claims. Achieving an equal gate thickness is important to forming an HKMG semiconductor device, in particular, in the VTFETs is very critical to forming HKMG CMOS. However, the related art methods do not provide VTFETs with an equal gate thickness.

In contrast to the related art methods, the exemplary aspects of the present invention may provide a semiconductor device with VTFETs having substantially the same (e.g., equal) gate thickness. That is, a thickness of a gate for the p-type FET may have substantially the same thickness as a gate for the n-type FET in the semiconductor device formed according to an exemplary aspect of the present invention.

The terms "same", "equal", "same thickness" and "equal thickness" should be understood to mean plus-or-minus 10%. Thus, for example where a thickness of the gate of the p-type FET is 20 nm, a thickness of the gate of the n-type FET may be considered to be the "same thickness" as the thickness of the p-type FET if the thickness of the gate is from 18 nm to 22 nm.

Referring again to the drawings, FIG. 1 illustrates a method 100 of forming a semiconductor device, according to an exemplary aspect of the present invention.

As illustrated in FIG. 1, the method 100 includes forming (110) a first work function metal and sacrificial layer on an n-type field effect transistor (nFET) and on a p-type field effect transistor (pFET), removing (120) the sacrificial layer and the first work function metal from one of the nFET and the pFET, forming (130) a second work function metal on the one of the nFET and the pFET, a thickness of the second work function metal being substantially the same as a thickness of the first work function metal, and removing (140) the sacrificial layer from the other of the nFET and the pFET.

The method 100 may also include forming a high-k dielectric layer on the nFET and the pFET. In this case, the first work function metal and sacrificial layer may be formed on the high-k dielectric layer.

Further, the nFET and pFET may each include a fin (e.g., doped semiconductor fin). In this case, the high-k dielectric layer may be formed on the fins of the nFET and pFET. Further, the first work function metal and sacrificial layer may be formed on the high-k dielectric layer on the fins of the nFET and pFET.

Further, the method 100 may form the gate of the pFET first, and the gate of the nFET second. In this case, the first work function metal may include a pFET work function metal, and the removing (120) of the sacrificial layer and the first work function metal may include masking the pFET and removing the sacrificial layer and the pFET work function metal from the nFET. In addition, the forming (130) of the second work function metal may include forming an nFET work function metal on the nFET, and the removing (140) of the sacrificial layer may include removing the sacrificial layer from the pFET.

Alternatively, the method 100 may form the gate of the nFET first, and the gate of the pFET second. In this case, the first work function metal may include an nFET work function metal, and the removing (120) of the sacrificial layer and the first work function metal may include masking the nFET and removing the sacrificial layer and the nFET work function metal from the pFET. In addition, the forming (130) of the second work function metal may include forming an pFET work function metal on the pFET, and the removing (140) of the sacrificial layer may include removing the sacrificial layer from the nFET.

The method 100 may also include forming a sacrificial cap layer on the sacrificial layer. In this case, the removing (120) of the sacrificial layer and the first work function may include removing the sacrificial cap layer, the sacrificial layer and the first work function metal, and the removing (140) of the sacrificial layer may include removing the sacrificial cap layer and the sacrificial layer.

Further, the forming (130) of the second work function metal may include forming the second work function metal on the nFET and the pFET, masking the one of the nFET and the pFET, and removing the second work function metal on the other of the nFET and the pFET. In this case, the removing (140) of the sacrificial layer may be performed after the removing of the second work function metal.

Further, the second work function metal may be formed such that a portion of the second work function metal overlaps a portion of the first work function metal. In this case, a length of the overlapped portion of the first work function metal may be less than 60 nm.

Alternatively, the second work function metal may be formed such that a gap is formed between the second work function metal and the first work function metal. In this case, a width of the gap may be less than 60 nm. In addition, a common metal layer may be formed on the nFET and the pFET, between and electrically connecting the first and second work function metals.

Figure 2A:
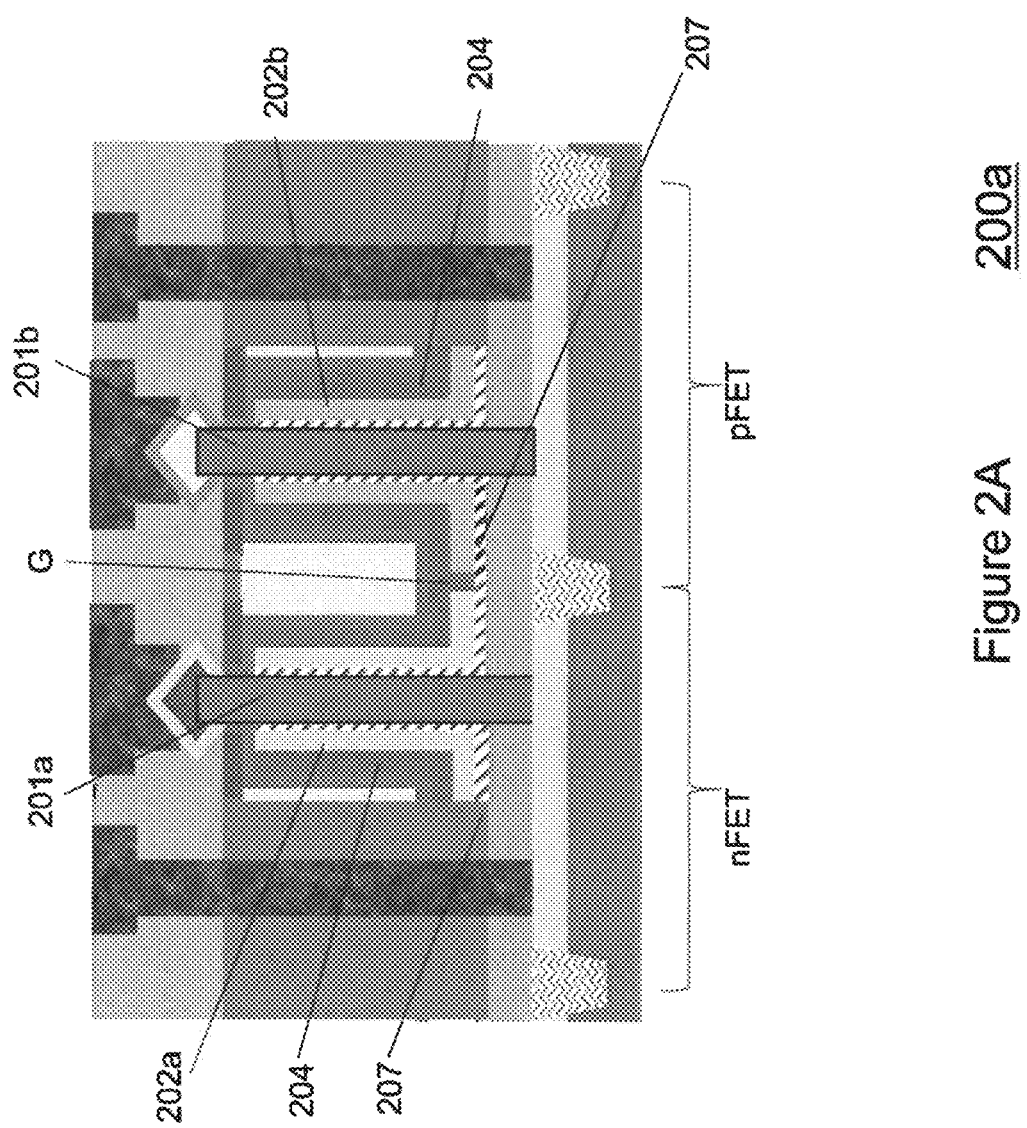
FIG. 2A illustrates a semiconductor device 200a having an underlapped pattern, according to an exemplary aspect of the present invention.
Figures 2B, 2C:
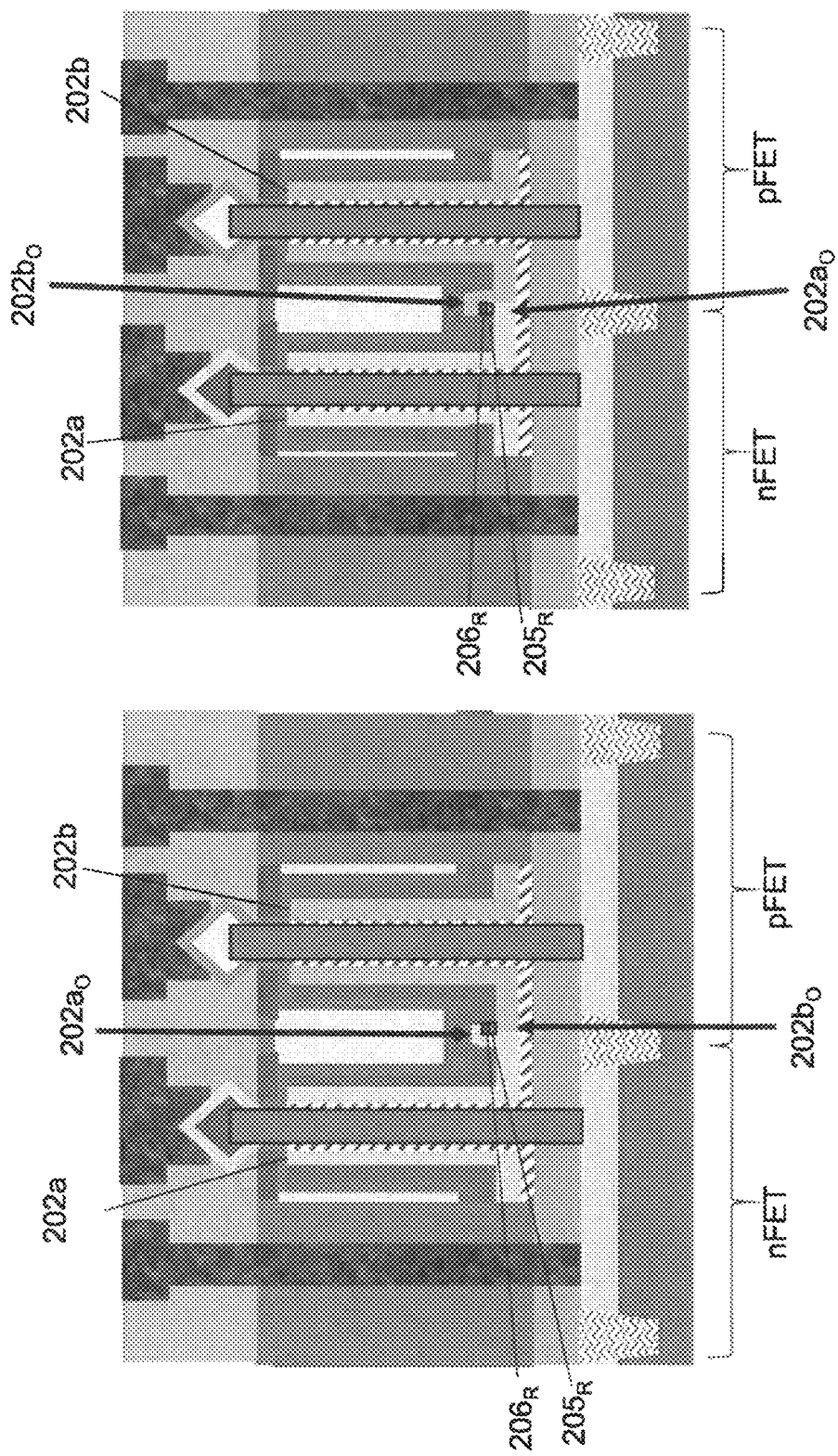
FIG. 2B illustrates a semiconductor device 200b having a pFET-first, overlapped pattern, according to an exemplary aspect of the present invention.
FIG. 2C illustrates a semiconductor device 200c having an nFET-first, overlapped pattern, according to an exemplary aspect of the present invention.

FIGS. 2A-2C illustrate a semiconductor device 200a-200c (e.g., CMOS device), according to an exemplary aspect of the present invention.

In particular, FIG. 2A illustrates a semiconductor device 200a having an underlapped pattern, according to an exemplary aspect of the present invention.

As illustrated in FIG. 2a, the semiconductor device 200a includes an n-type field effect transistor (nFET) including a first fin 201a and a first metal gate 202a formed on the first fin 201a, and a p-type field effect transistor (pFET) including a second fin 201b and a second metal gate 202b formed on the second fin 201b.

A thickness of the second metal gate 202b is substantially the same as a thickness of the first metal gate 202a. In particular, a thickness of the first and second metal gates 202a, 202b may be in a range from 2 nm to 10 nm. A difference in thickness between the first and second metal gates 202a, 202b may be no more than 4 nm. Thus, for example, if a thickness of the first metal gate 202a is 6 nm, then a thickness of the second metal gate 202b should be in a range from 2 nm to 10 nm, and so on.

Further, the first metal gate may include a material which is different from a material of the second metal gate. For example, the first metal gate may be an nFET metal layer such as Ti, Al, TiAl, TiAlC, and TaAlC or metal stack of TiN/TiAl/TiN, TiN/TiAlC/TiN TiN/TaAlC/TiN, or any combination of TiN layer and Al alloys, and the second metal gate may be a pFET metal such as TiN, TiC, TaN, and W The semiconductor device 200a may also include high-k dielectric layer 207 formed between the first metal gate 202a and the first fin 201a of the nFET, and between the second metal gate 202b and the second fin 201b of the pFET. The high-k dielectric layer 207 may be formed for example of HfO$_2$ and may have a thickness in a range from 1 nm to 3 nm.

As illustrated in FIG. 200a, the semiconductor device 200a includes an underlapped configuration so that a gap G formed between the first metal gate 202a and the second metal gate 202b. The width of the gap (i.e., a distance separating the first and second metal gates 202a, 202b) may be no greater than 60 nm.

In addition, the semiconductor device 200a may include a common metal layer 204 formed on the first metal gate of the nFET and the second metal gate of the pFET, and in the gap G between the first and second metal gate 202a, 202b. The common metal layer 204 may electrically connect the first and second metal gates 202a, 202b.

It should be noted that the semiconductor device 200a having an underlapped pattern may have the same configuration regardless of whether the metal gate 202a is formed first and the metal gate 202b is formed second, or the metal gate 202b is formed first and the metal gate 202a is formed second.

FIG. 2B illustrates a semiconductor device 200b having a pFET-first, overlapped pattern, according to an exemplary aspect of the present invention.

As illustrated in FIG. 2B, a configuration of the semiconductor device 200b is similar to a configuration of the semiconductor device 200a. However, in the semiconductor device 200b, there is no gap G formed between the first and second metal gates 202a, 202b. Instead, the second metal gate 202b is formed first (i.e., pFET first), and then the first metal gate 202a is formed on the second metal gate 202b, so that a portion $202a_O$ of the first metal gate 202a "overlaps" a portion $202b_O$ of the second metal gate 202b.

As also illustrated in FIG. 2B, the semiconductor device 200b may include a remnant $205_R$ of a sacrificial layer 205 (e.g., an oxide layer) and a remnant $206_R$ of sacrificial cap layer 206 (e.g., TiN), which are utilized in forming the semiconductor device 200b. These remnants $205_R$, $206_R$ may remain on the second metal gate 202b and therefore, between the overlapping portion $202a_O$ and the overlapped portion $202b_O$.

FIG. 2C illustrates a semiconductor device 200c having an nFET-first, overlapped pattern, according to an exemplary aspect of the present invention.

As illustrated in FIG. 2C, a configuration of the semiconductor device 200c is similar to a configuration of the semiconductor device 200b. However, in the semiconductor device 200c, the first metal gate 202a is formed first (i.e., nFET first), and then the second metal gate 202b is formed on the first metal gate 202a, so that a portion $202b_O$ of the second metal gate 202b "overlaps" a portion $202a_O$ of the first metal gate 202a.

As also illustrated in FIG. 2C, the remnants $205_R$, $206_R$ remain on the first metal gate 202a and therefore, between the overlapping portion $202b_O$ and the overlapped portion $202a_O$.

Figure 3:
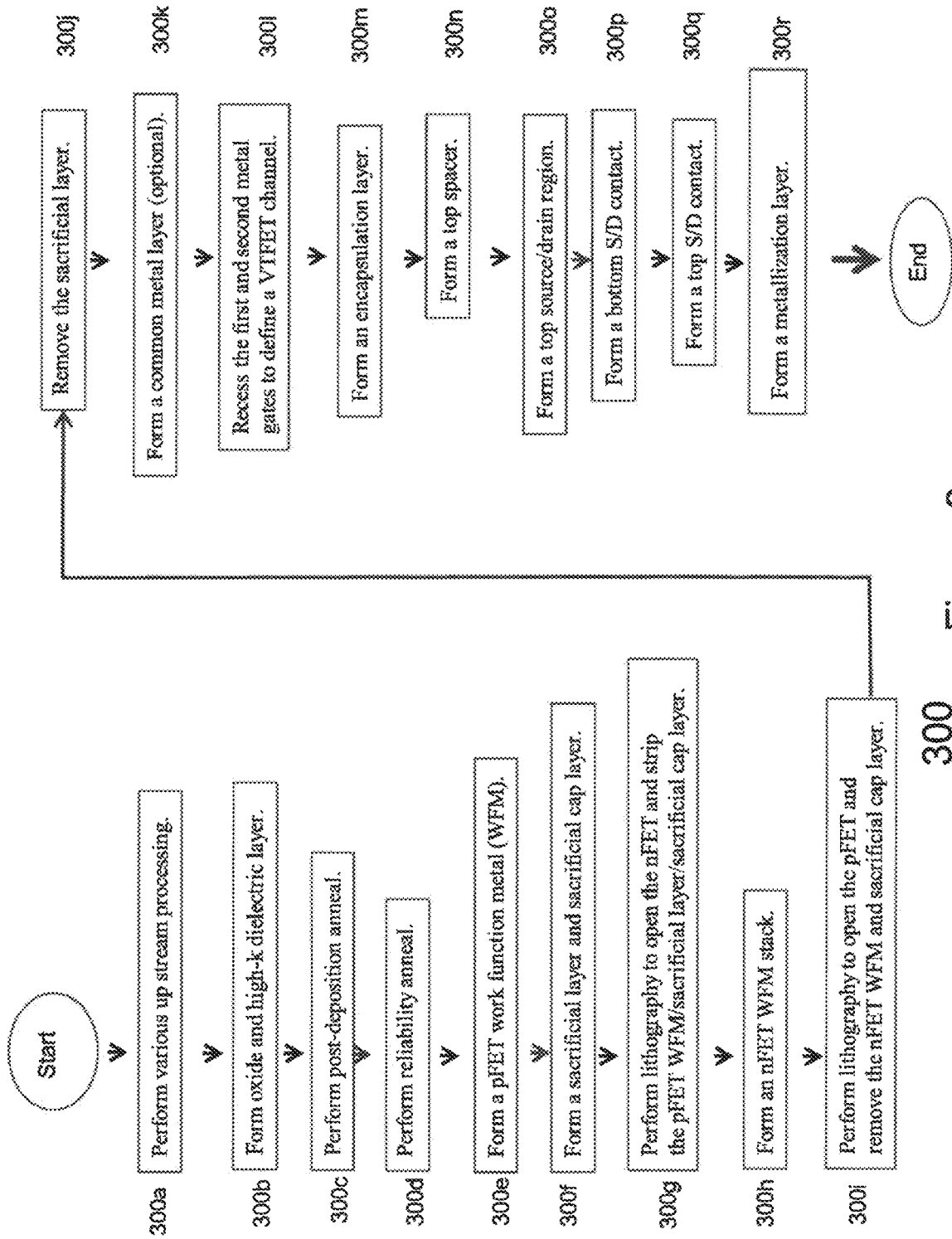
FIG. 3 is a flow chart for a method 300 of forming a semiconductor device having a pFET first pattern (underlapped or overlapped), according to another exemplary aspect of the present invention.

FIG. 3 is a flow chart for a method 300 of forming a semiconductor device having a pFET first pattern (underlapped or overlapped), according to another exemplary aspect of the present invention.

As illustrated in FIG. 3, the method 300 includes various up stream processing 300a (e.g., forming a bottom contact, bottom spacer (e.g., $SiO_2$, SiN), and nFET and pFET fins), forming (e.g., growing) 300b an oxide layer (e.g., $SiO_2$) and high-k dielectric layer (e.g., $HfO_2$), a post-deposition anneal 300c and reliability anneal 300d.

The method 300 also includes forming 300e a pFET work function metal (WFM) (e.g., TiN or a metal stack, etc.), forming 300f (e.g., by deposition) a sacrificial layer (e.g., oxide) and sacrificial cap layer (e.g., TiN), performing lithography 300g to open the nFET and strip the pFET WFM/sacrificial layer/sacrificial cap layer, forming 300h (e.g., by deposition) an nFET WFM stack, performing lithography 300i to open the pFET and remove (e.g., strip) the nFET WFM and sacrificial cap layer, and removing (e.g., stripping) 300j the sacrificial layer.

The method 300 may also include forming 300k (e.g., by deposition) a common metal layer deposition. However, this may be optional. In particular, the forming 300k of the common metal layer may be utilized with an underlapped configuration in order to electrically connect the first and second metal gates 202a, 202b (e.g., see FIG. 2A).

The method 300 may also include recessing 300l the first and second metal gates to define a VTFET channel, forming 300m (e.g., by deposition) an encapsulation layer, forming 300n a top spacer, forming 300o (e.g., by epitaxial growth) a top source/drain region, forming 300p a bottom S/D contact, forming 300q a top S/D contact, and forming 300r a metallization layer (M1).

It should be noted that the term "deposition" may be understood to include physical vapor deposition (PVD), chemical vapor deposition (CVD) and atomic layer deposition (ALD). In addition, the terms "removing" or "stripping" a layer or part of a layer may be understood to include etching such as wet etching and dry etching.

Figure 4C:
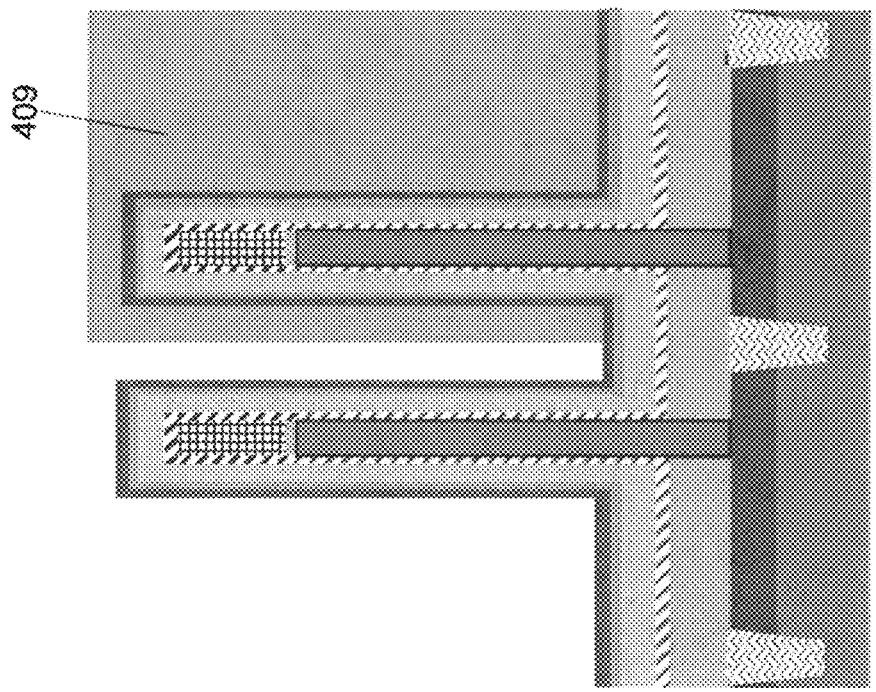
FIG. 4C illustrates the forming of the sacrificial layer 405 on the pFET WFM 402/402b, and the forming of the sacrificial cap layer 406 on the sacrificial layer 405, according to an exemplary aspect of the present invention.
Figure 4D:
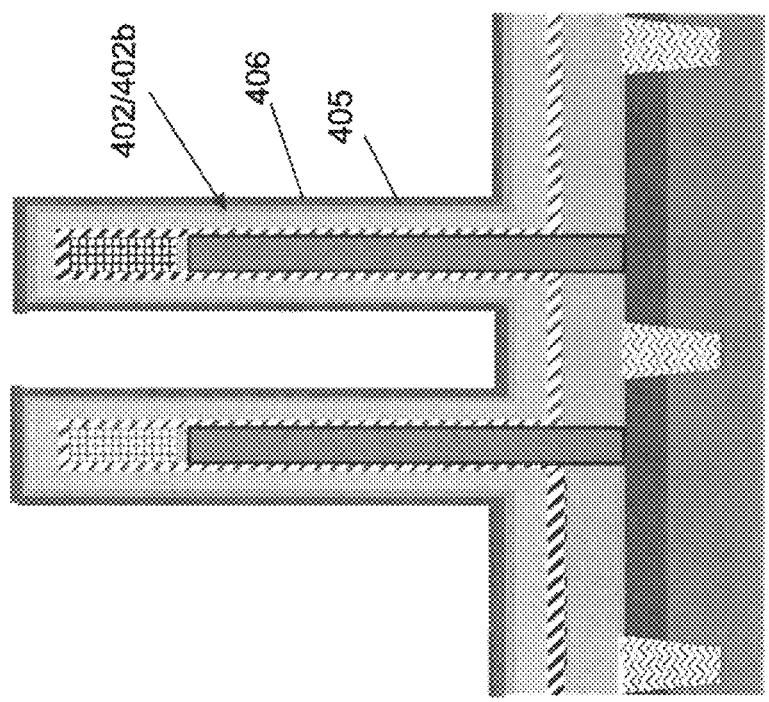
FIG. 4D illustrates the forming of a mask 409 on the pFET, according to an exemplary aspect of the present invention.
Figure 4E:
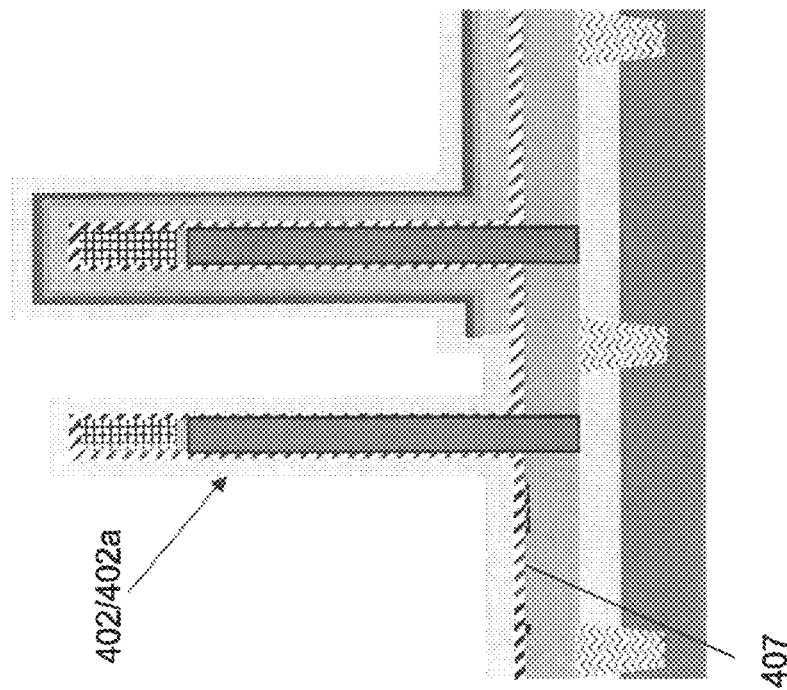
FIG. 4E illustrates the removing (e.g., stripping, etching away etc.) of the sacrificial cap layer 406, the sacrificial layer 405, and the pFET WFM 402/402b on the nFET, according to an exemplary aspect of the present invention.
Figure 4F:
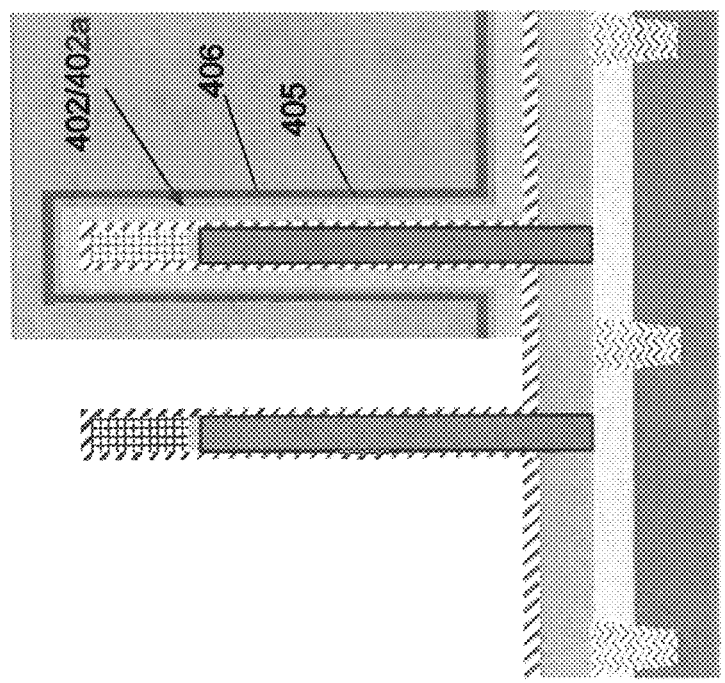
FIG. 4F illustrates the forming of an nFET WFM stack 402/402a (which later becomes the metal gate 402a of the nFET) on the high-k dielectric layer 407 on the nFET, according to an exemplary aspect of the present invention.
Figure 4H:
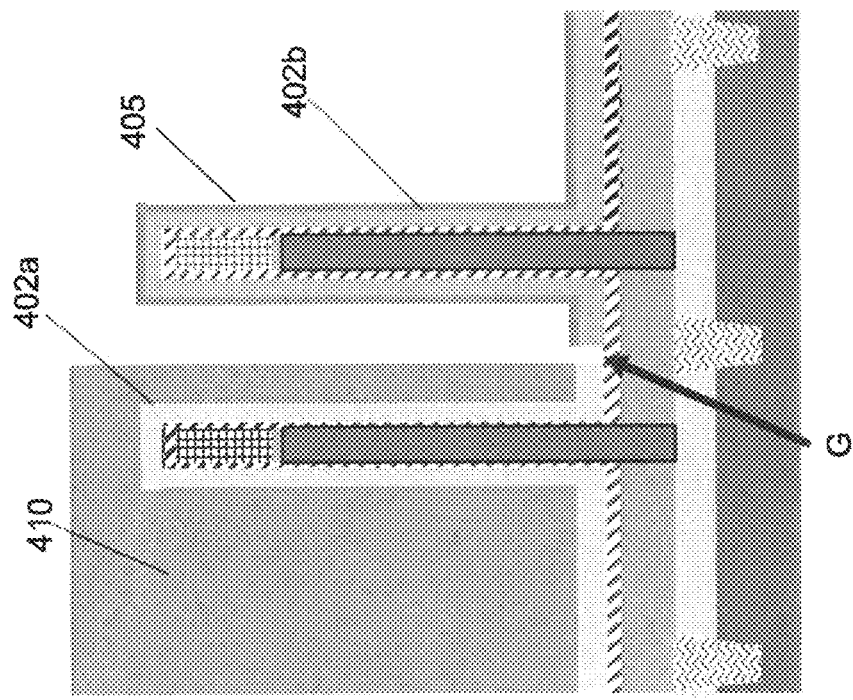
FIG. 4H illustrates the removing (e.g., stripping, etching away etc.) of the nFET WFM 402/402a and the sacrificial cap layer 406 on the pFET, forming the metal gate 402a for the nFET and the metal gate 402b for the pFET, according to an exemplary aspect of the present invention.
Figure 4G:
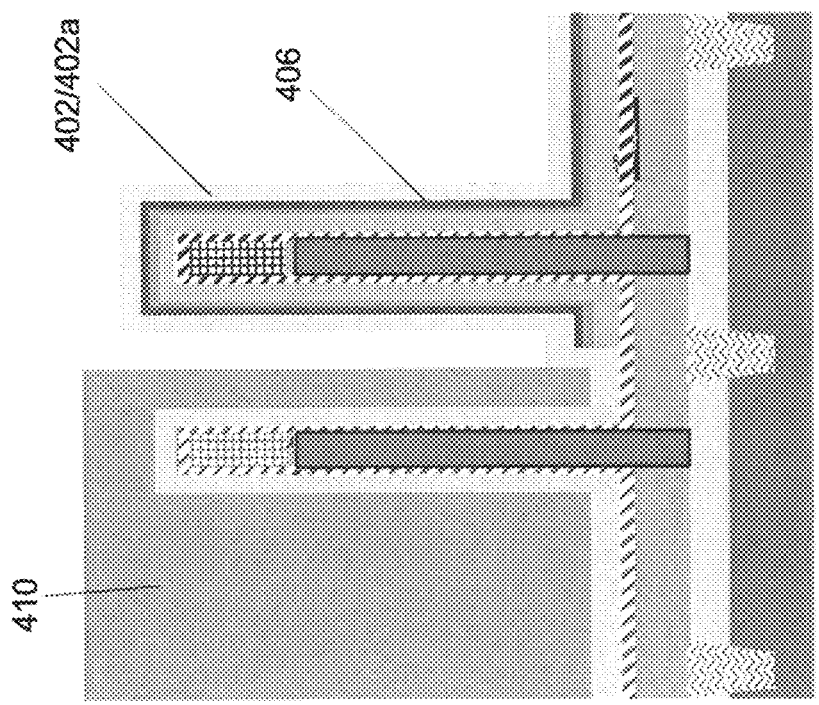
FIG. 4G illustrates the forming of a mask 410 on the nFET, according to an exemplary aspect of the present invention.
Figure 4J:
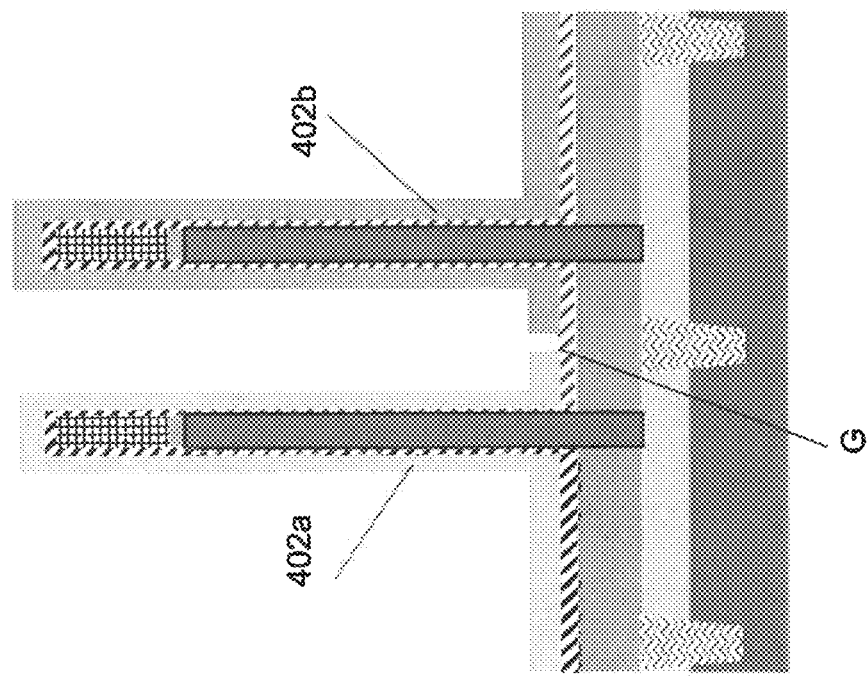
FIG. 4J illustrates the removing of the mask 410 to expose the metal gate 402a (e.g., after patterning), according to an exemplary aspect of the present invention.
Figure 4I:
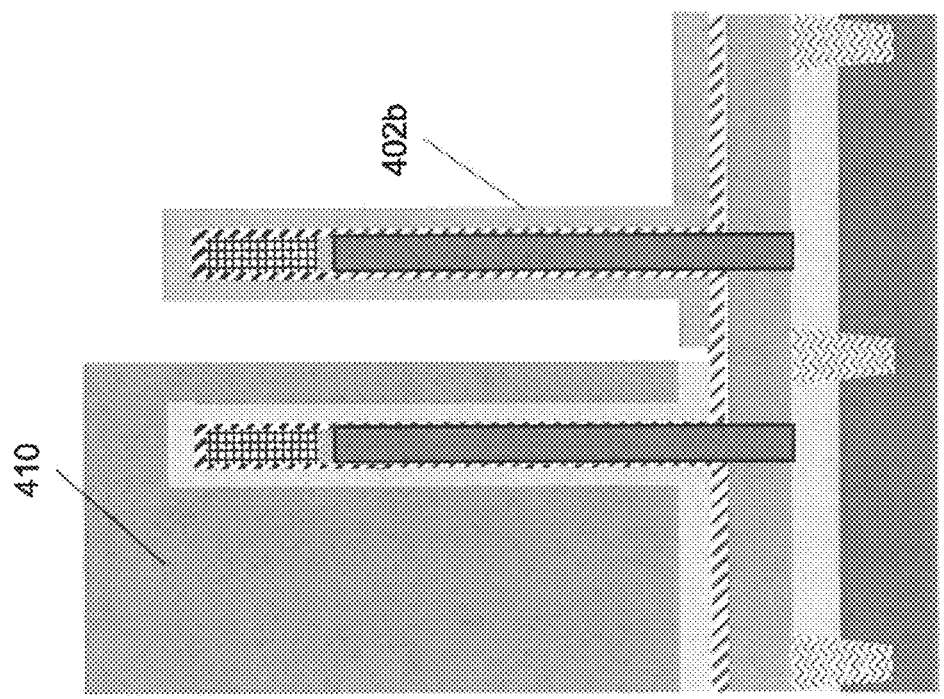
FIG. 4I illustrates the removing of the sacrificial layer 405 from the pFET, exposing the metal gate 402b, according to an exemplary aspect of the present invention.
Figure 4L:
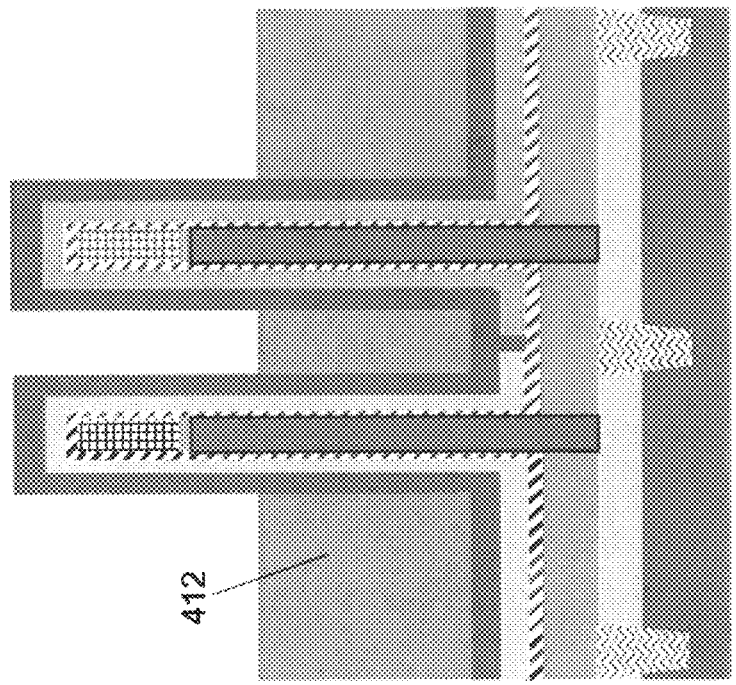
FIG. 4L illustrates the forming of an organic planarization layer (OPL) 412 on the nFET and pFET, and the recessing of the OPL 412, such as by wet etch (or dry etch), according to an exemplary aspect of the present invention.
Figure 4K:
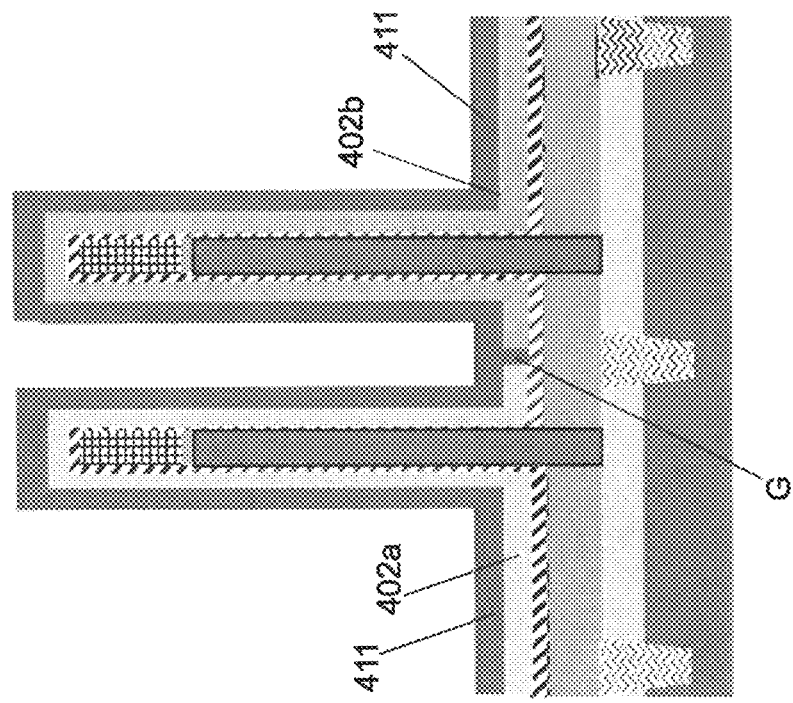
FIG. 4K illustrates the forming of a common metal layer 411 on the nFET and pFET, and inside the gap according to an exemplary aspect of the present invention.
Figure 4N:
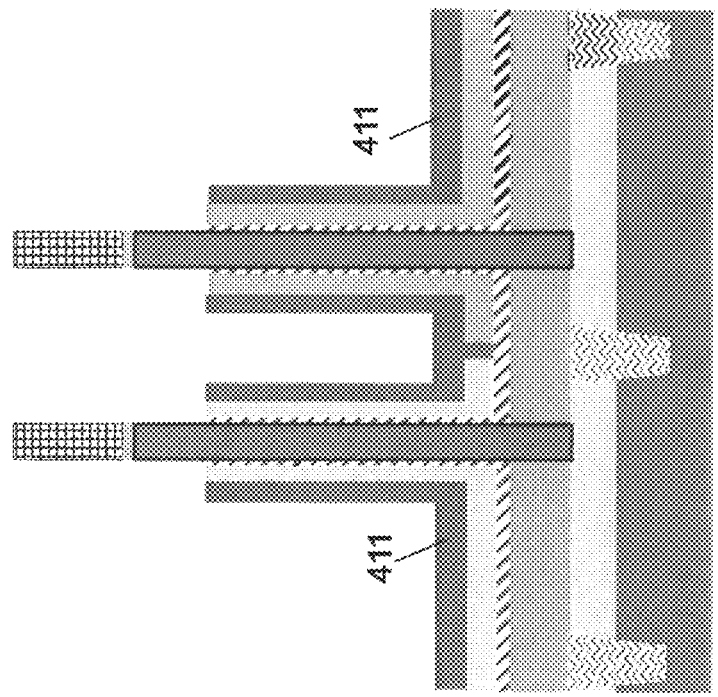
FIG. 4N illustrates the removal of the OPL 412, exposing the common metal layer 411, according to an exemplary aspect of the present invention.
Figure 4M:
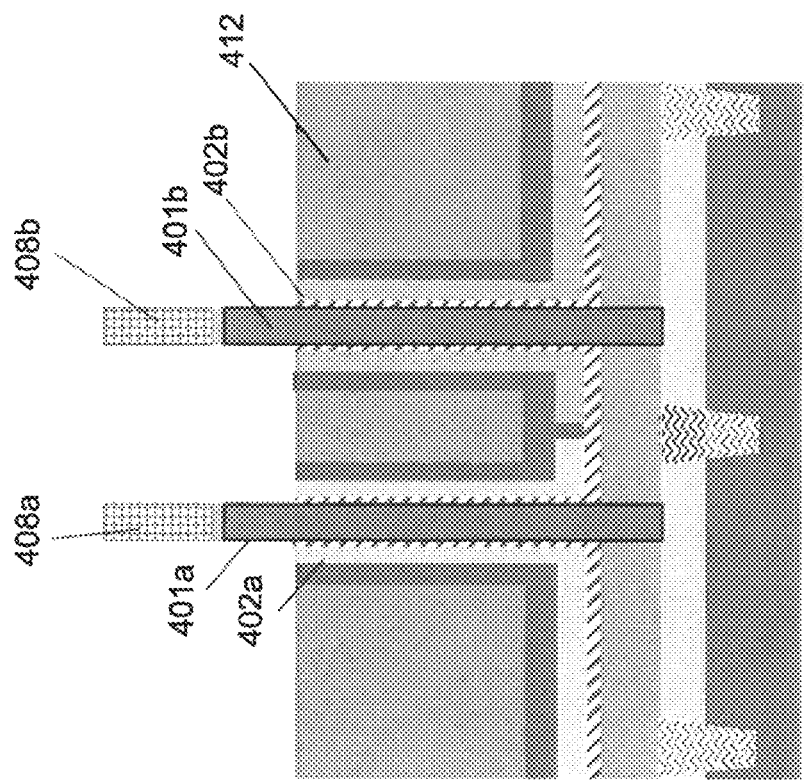
FIG. 4M illustrates the recessing of the metal gates 402a, 402b by wet etch (or dry etch), according to an exemplary aspect of the present invention.
Figure 4P:
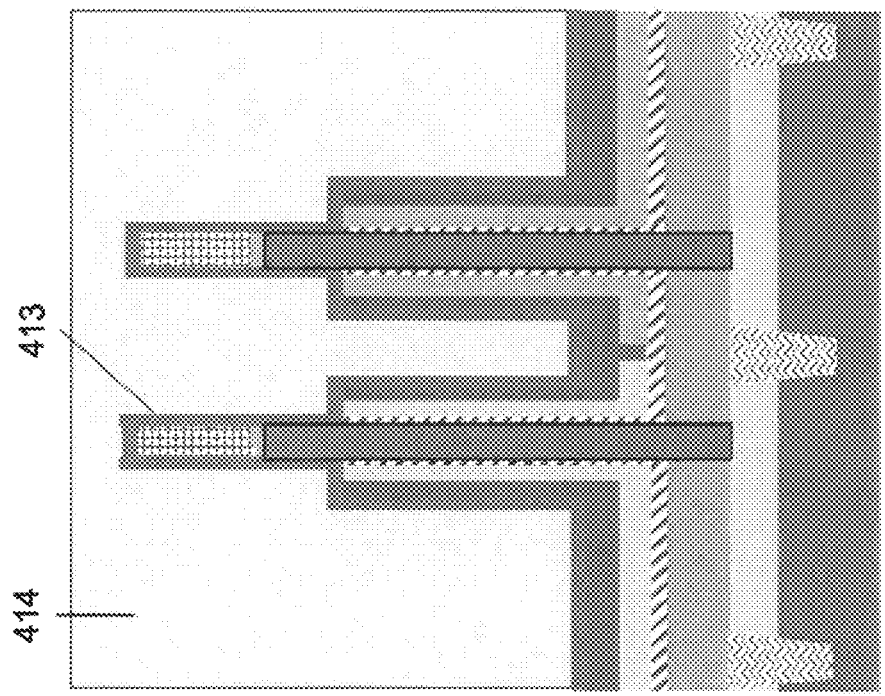
FIG. 4P illustrates the forming of a gap oxide fill 414 (e.g., $SiO_2$) on the encapsulation layer 413, according to an exemplary aspect of the present invention.
Figure 4O:
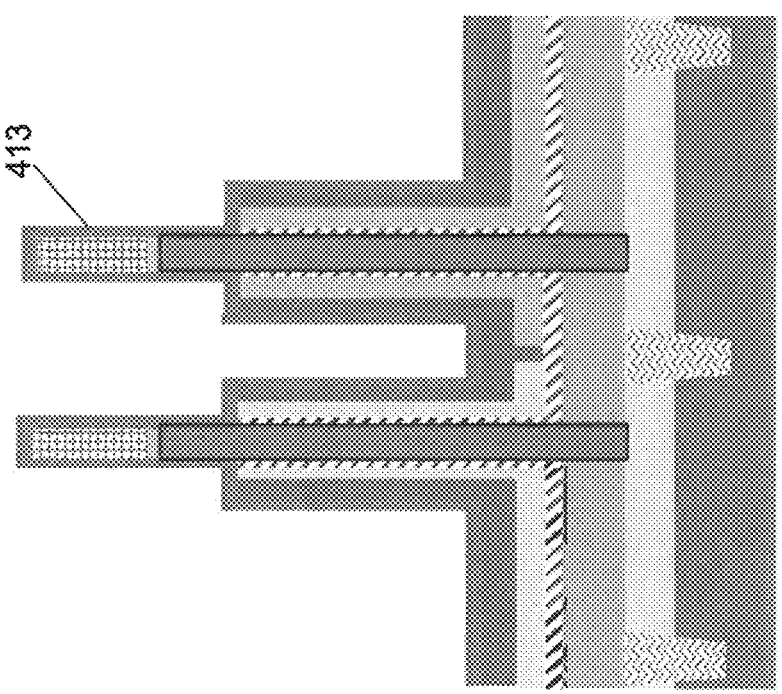
FIG. 4O illustrates the forming of an encapsulation layer 413 (e.g., SiN) on the nFET and pFET, according to an exemplary aspect of the present invention.
Figure 4R:
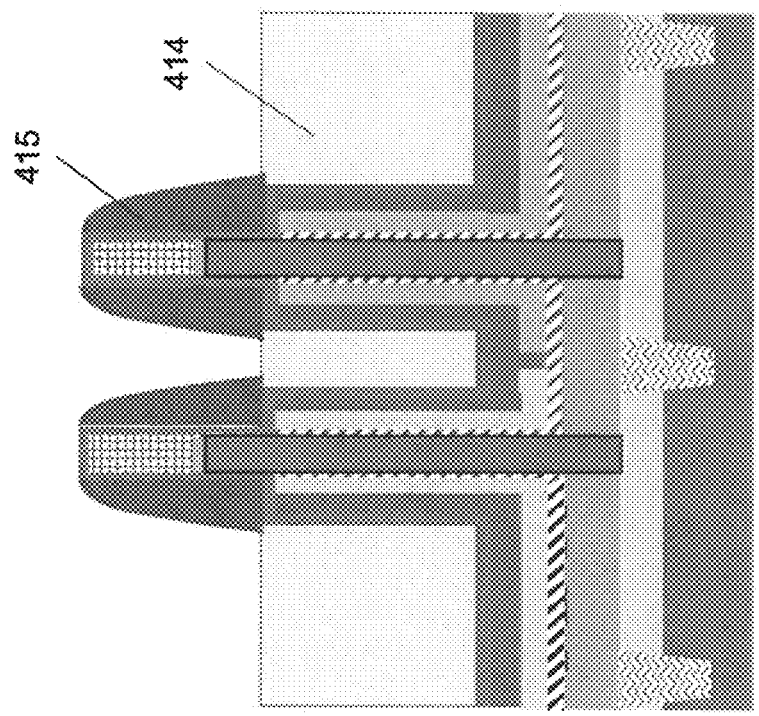
FIG. 4R illustrates the etching (e.g., dry etching) of the top spacer 415 to form a self-alignment gate and expose the gap oxide fill 414, according to an exemplary aspect of the present invention.
Figure 4Q:
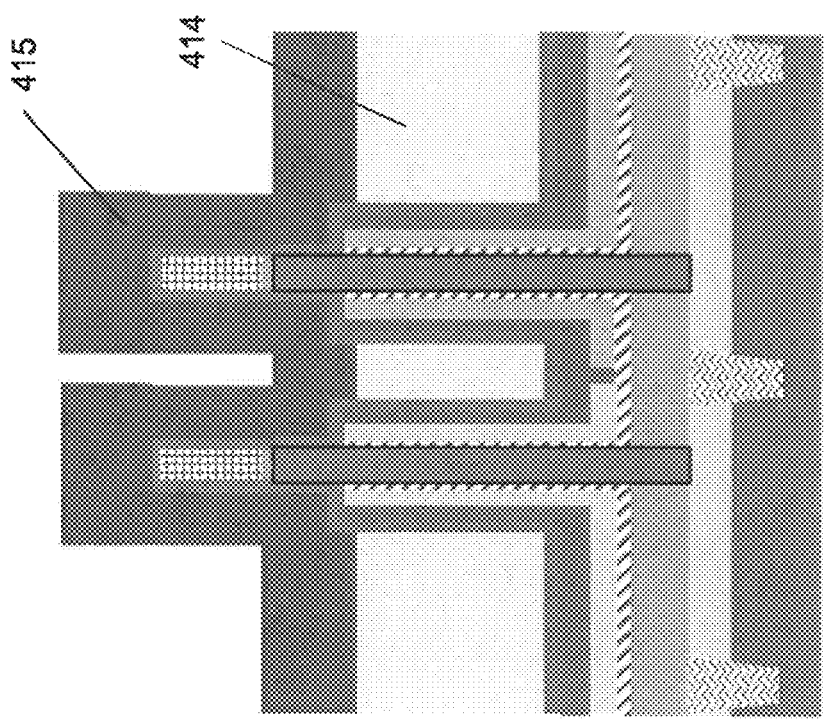
FIG. 4Q illustrates a recessing of the gap oxide fill 414 (e.g., by wet or dry etching) and the forming (e.g., by deposition) of a top spacer 415 (e.g., SiN), according to an exemplary aspect of the present invention.
Figure 4T:
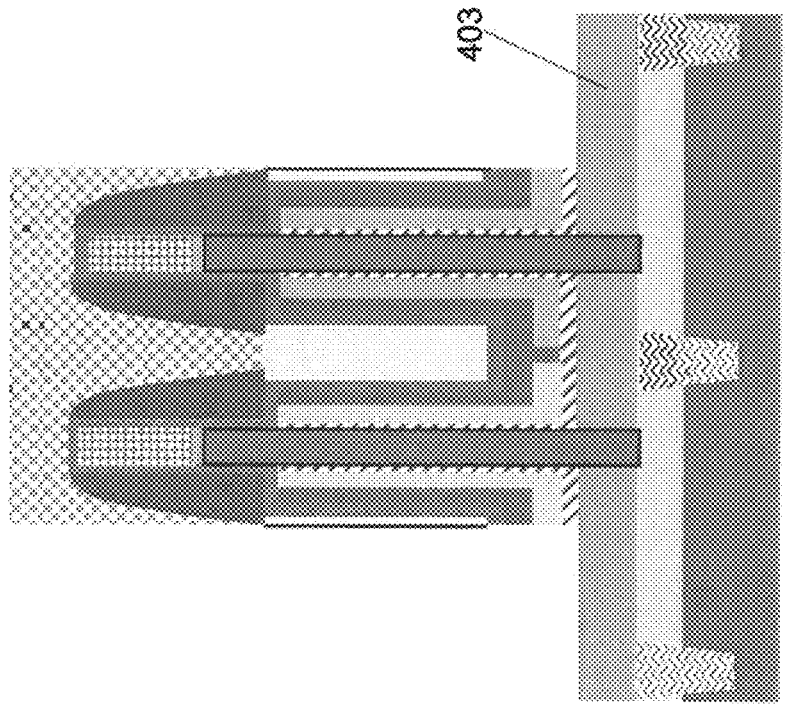
FIG. 4T illustrates the etching of the self-alignment gate, to expose the bottom spacer 403, according to an exemplary aspect of the present invention.
Figure 4S:
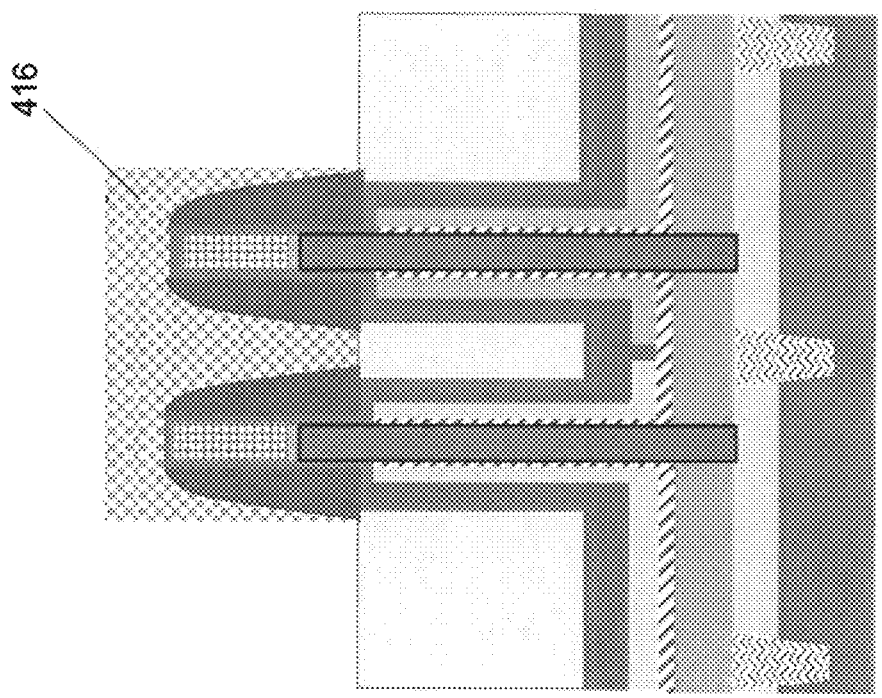
FIG. 4S illustrates the forming of a shared gate protection hard mask 416 on the nFET and pFET, according to an exemplary aspect of the present invention.
Figure 4V:
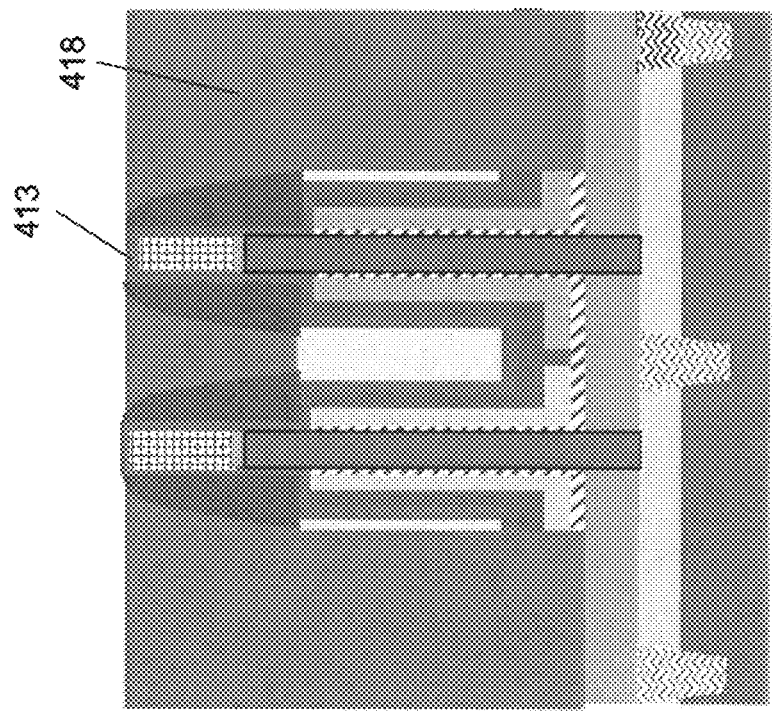
FIG. 4V illustrates the planarization (e.g., chemical mechanical planarization (CMP)) of the gap oxide fill 418 to expose a surface of the encapsulation layer 413, according to an exemplary aspect of the present invention.
Figure 4U:
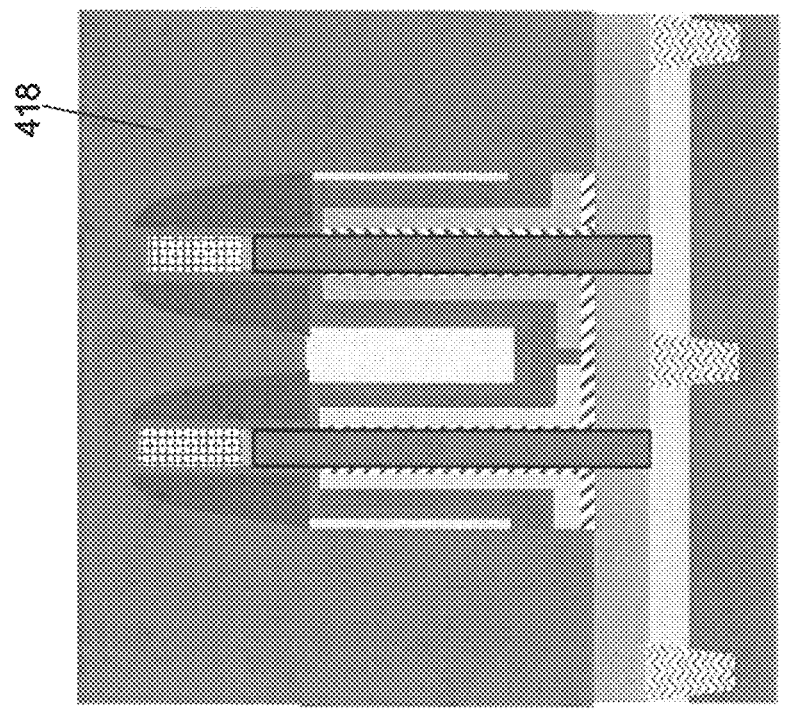
FIG. 4U illustrates the forming of a gap oxide fill 418 (e.g., $SiO_2$), according to an exemplary aspect of the present invention.
Figure 4X:
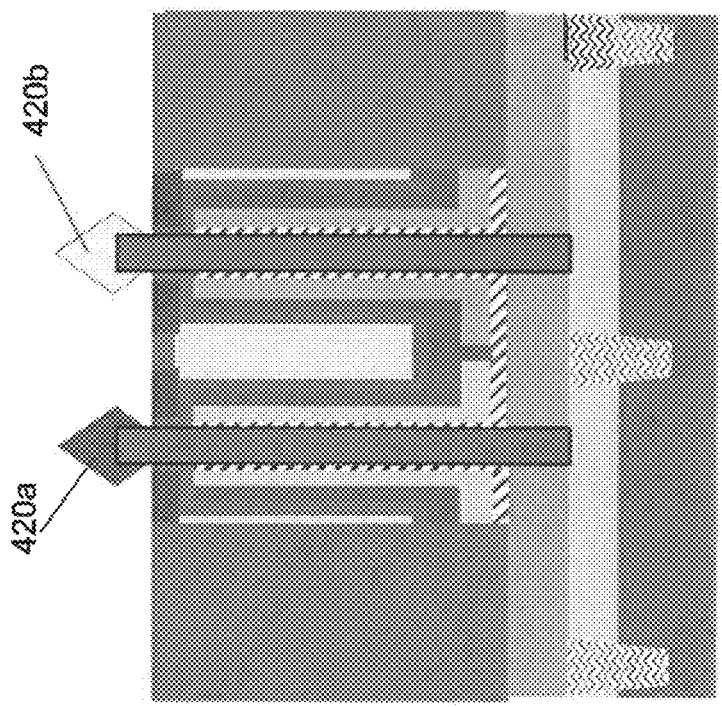
FIG. 4X illustrates the forming of the epitaxial growth of the top source/drain layers 420a, 420b (e.g., n-type epitaxial grown on the nFET and p-type epitaxial growth on the pFET), according to an exemplary aspect of the present invention.
Figure 4W:
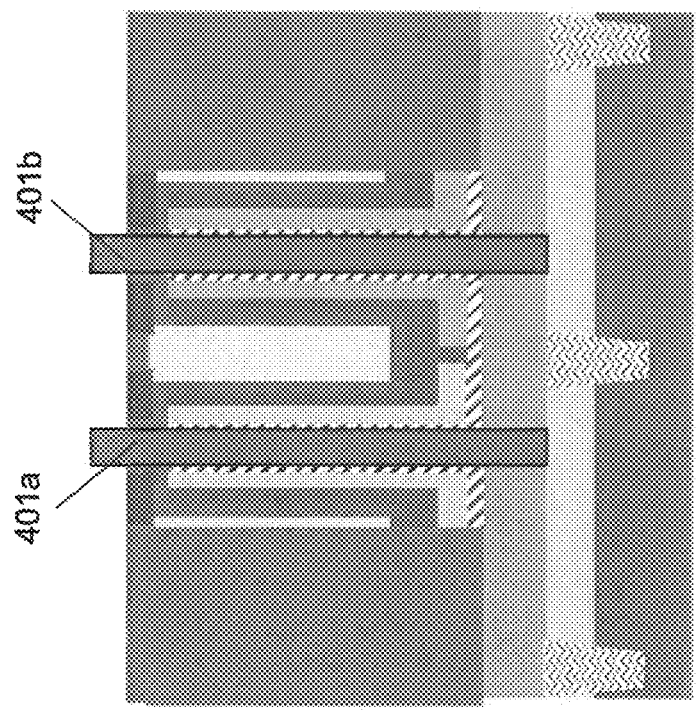
FIG. 4W illustrates an etching (e.g., nitride and oxide non-selective etch) of the top spacer 415, the gap oxide fill 418, the hard mask 408a, 408b, the oxide layer 419a, 419b, and the encapsulation layer 413 to expose the upper surface of the fins 401a, 401b, according to an exemplary aspect of the present invention.
Figure 4Z:
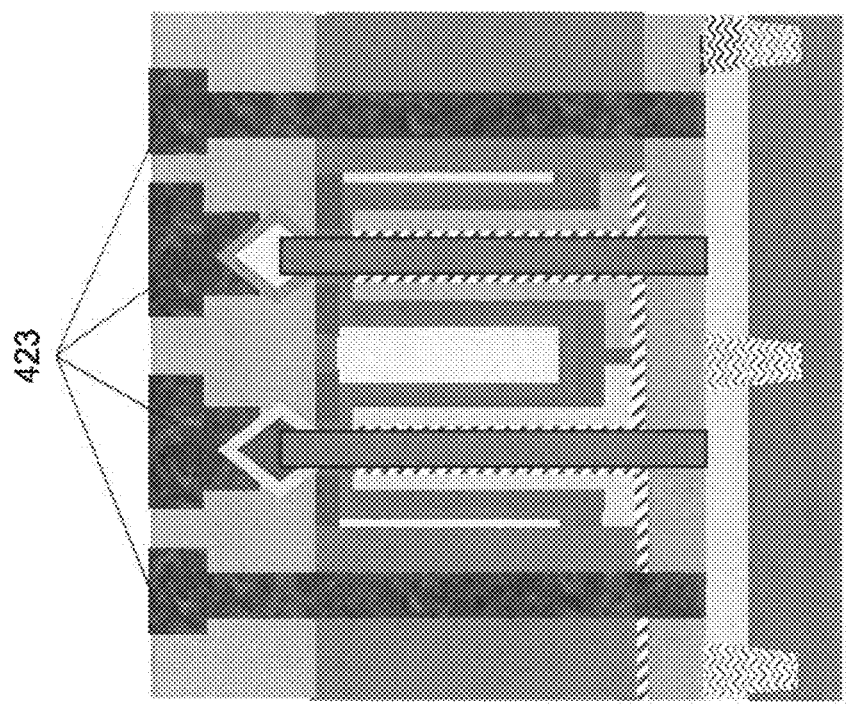
FIG. 4Z illustrates the forming of contacts 423, according to an exemplary aspect of the present invention.

FIGS. 4A-4Z illustrate a method 400 of forming a semiconductor device with a pFET-first underlapped pattern, according to another exemplary aspect of the present invention.

In particular, FIG. 4A illustrates (e.g., after performing a reliability strip) the forming of a high-k dielectric layer 407 (e.g., $HfO_2$, etc.) on the bottom spacer 403 (e.g., $SiO_2$, SiN, etc.), the fins 401a, 401b, the oxide layer 419a, 419b (e.g., $SiO_2$), and the hard mask (e.g., SiN) 408a, 408b, according to an exemplary aspect of the present invention.

FIG. 4B illustrates the forming of the pFET WFM 402/402b (e.g., TiN) (e.g., which becomes the metal gate 402b of the pFET) on the high-k dielectric layer 407, according to an exemplary aspect of the present invention.

FIG. 4C illustrates the forming of the sacrificial layer 405 on the pFET WFM 402/402b, and the forming of the sacrificial cap layer 406 on the sacrificial layer 405, according to an exemplary aspect of the present invention.

FIG. 4D illustrates the forming of a mask 409 on the pFET, according to an exemplary aspect of the present invention.

FIG. 4E illustrates the removing (e.g., stripping, etching away etc.) of the sacrificial cap layer 406, the sacrificial layer 405, and the pFET WFM 402/402b on the nFET, according to an exemplary aspect of the present invention.

FIG. 4F illustrates the forming of an nFET WFM stack 402/402a (which later becomes the metal gate 402a of the nFET) on the high-k dielectric layer 407 on the nFET, according to an exemplary aspect of the present invention.

FIG. 4G illustrates the forming of a mask 410 on the nFET, according to an exemplary aspect of the present invention.

FIG. 4H illustrates the removing (e.g., stripping, etching away etc.) of the nFET WFM 402/402a and the sacrificial cap layer 406 on the pFET, forming the metal gate 402a for the nFET and the metal gate 402b for the pFET, according to an exemplary aspect of the present invention. It should be noted that the nFET WFM 402/402a may be etched so as to form the gap G between the metal gates 402a, 402b.

FIG. 4I illustrates the removing of the sacrificial layer 405 from the pFET, exposing the metal gate 402b, according to an exemplary aspect of the present invention.

FIG. 4J illustrates the removing of the mask 410 to expose the metal gate 402a (e.g., after patterning), according to an exemplary aspect of the present invention.

FIG. 4K illustrates the forming of a common metal layer 411 on the nFET and pFET, and inside the gap G, according to an exemplary aspect of the present invention. The common metal layer 411 may be a pure metal layer or an alloy compound or a metal stack which can be used a conductor. The material could be, but not limited to, TiN and W A thickness of the common metal layer 411 may be in a range from 2 nm to 10 nm. However, the thickness of the common metal layer 411 in the gap G may be greater then (e.g., twice or more) the thickness of the common metal layer 411 on the upper surface of the metal gates 402a, 402b.

FIG. 4L illustrates the forming of an organic planarization layer (OPL) 412 on the nFET and pFET, and the recessing of the OPL 412, such as by wet etch (or dry etch), according to an exemplary aspect of the present invention.

FIG. 4M illustrates the recessing of the metal gates 402a, 402b by wet etch (or dry etch), according to an exemplary aspect of the present invention. In this process, the hard mask 408a, 408b and an upper portion of the fins 401a, 401b are exposed.

FIG. 4N illustrates the removal of the OPL 412, exposing the common metal layer 411, according to an exemplary aspect of the present invention.

FIG. 4O illustrates the forming of an encapsulation layer 413 (e.g., SiN) on the nFET and pFET, according to an exemplary aspect of the present invention.

FIG. 4P illustrates the forming of a gap oxide fill 414 (e.g., $SiO_2$) on the encapsulation layer 413, according to an exemplary aspect of the present invention.

FIG. 4Q illustrates a recessing of the gap oxide fill 414 (e.g., by wet or dry etching) and the forming (e.g., by deposition) of a top spacer 415 (e.g., SiN), according to an exemplary aspect of the present invention.

FIG. 4R illustrates the etching (e.g., dry etching) of the top spacer 415 to form a self-alignment gate and expose the gap oxide fill 414, according to an exemplary aspect of the present invention.

FIG. 4S illustrates the forming of a shared gate protection hard mask 416 on the nFET and pFET, according to an exemplary aspect of the present invention.

FIG. 4T illustrates the etching of the self-alignment gate, to expose the bottom spacer 403, according to an exemplary aspect of the present invention.

FIG. 4U illustrates the forming of a gap oxide fill 418 (e.g., $SiO_2$), according to an exemplary aspect of the present invention.

FIG. 4V illustrates the planarization (e.g., chemical mechanical planarization (CMP)) of the gap oxide fill 418 to expose a surface of the encapsulation layer 413, according to an exemplary aspect of the present invention.

FIG. 4W illustrates an etching (e.g., nitride and oxide non-selective etch) of the top spacer 415, the gap oxide fill 418, the hard mask 408a, 408b, the oxide layer 419a, 419b, and the encapsulation layer 413 to expose the upper surface of the fins 401a, 401b, according to an exemplary aspect of the present invention.

FIG. 4X illustrates the forming of the epitaxial growth of the top source/drain layers 420a, 420b (e.g., n-type epitaxial grown on the nFET and p-type epitaxial growth on the pFET), according to an exemplary aspect of the present invention.

Figure 4Y:
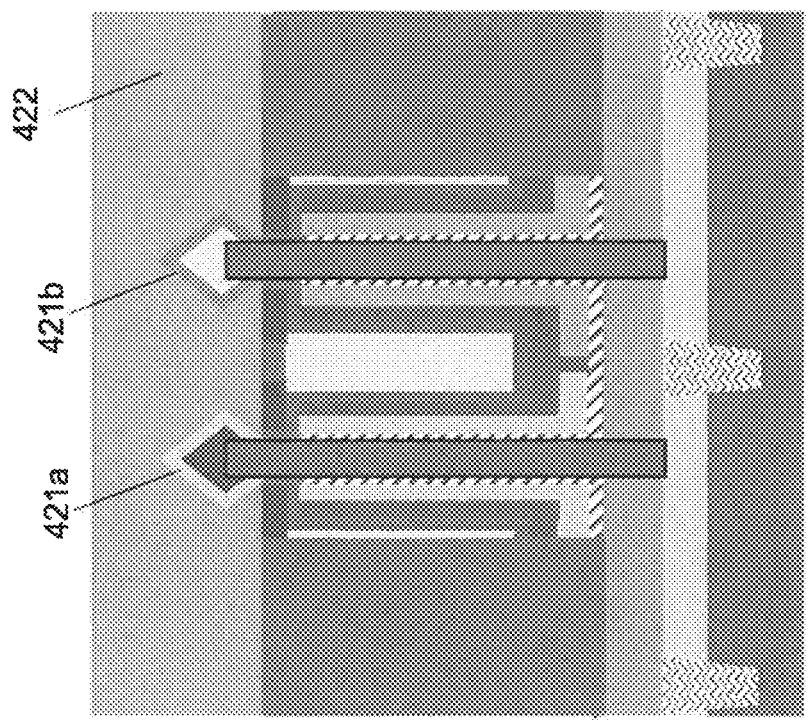
FIG. 4Y illustrates the forming of a top source/drain silicide 421a, 421b, and the forming of an oxide fill 422, according to an exemplary aspect of the present invention.

FIG. 4Y illustrates the forming of a top source/drain silicide 421a, 421b, and the forming of an oxide fill 422, according to an exemplary aspect of the present invention.

FIG. 4Z illustrates the forming of contacts 423, according to an exemplary aspect of the present invention. It should be noted that the resulting semiconductor device illustrated in FIG. 4Z is the same as the semiconductor device 200a illustrated in FIG. 2A.

Referring again to FIG. 2B, the method of forming semiconductor device 200b having a pFET-first, overlapped pattern in FIG. 2B is similar to the method of forming the semiconductor device illustrated in FIGS. 4A-4Z. However, to form the semiconductor device 200b, referring to FIGS. 4G-4H, the mask 410 is formed to cover the overlapping portions of the nFET WFM 402/402a, resulting in the formation of the overlapping portion $202a_O$ and the overlapped portion $202b_O$.

FIG. 5 is a flow chart for a method 500 of forming a semiconductor device having nFET first pattern (underlapped or overlapped), according to another exemplary aspect of the present invention.

As illustrated in FIG. 5, the method 500 includes various up stream processing 500a (e.g., forming a bottom contact, bottom spacer (e.g., $SiO_2$, SiN), and nFET and pFET fins), forming (e.g., growing) 500b an oxide layer (e.g., $SiO_2$) and high-k dielectric layer (e.g., $HfO_2$), a post-deposition anneal 500c and reliability anneal 500d.

The method 500 also includes forming 500e an nFET WFM stack, forming 500f (e.g., by deposition) a sacrificial layer (e.g., oxide) and sacrificial cap layer (e.g., TiN), performing lithography 500g to open the pFET and strip the nFET WFM/sacrificial layer/sacrificial cap layer, forming 500h (e.g., by deposition) a pFET WFM (e.g., TiN or a metal stack, etc.), performing lithography 500i to open the nFET and remove (e.g., strip) the pFET WFM and sacrificial cap layer, and removing (e.g., stripping) 500j the sacrificial layer.

The method 500 may also include forming 500k (e.g., by deposition) a common metal layer deposition. However, this may be optional. In particular, the forming 500k of the common metal layer may be utilized with an underlapped configuration in order to electrically connect the first and second metal gates 202a, 202b (e.g., see FIG. 2A).

The method 500 may also include recessing 500l the first and second metal gates to define a VTFET channel, forming 500m (e.g., by deposition) an encapsulation layer, forming 500n a top spacer, forming 500o (e.g., by epitaxial growth) a top source/drain region, forming 500p a bottom S/D contact, forming 500q a top S/D contact, and forming 500r a metallization layer (M1).

Again, it should be noted that the semiconductor device having an underlapped pattern (as opposed to an overlapped pattern) may have the same configuration regardless of whether the metal gate 402a is formed first and the metal gate 402b is formed second, or the metal gate 402b is formed first and the metal gate 402a is formed second. That is, the configuration of a semiconductor device having a pFET-first underlapped pattern may be the same as the configuration of a semiconductor device having an nFET-first underlapped pattern.

Referring again to FIG. 2C, the method of forming semiconductor device 200c having a nFET-first, overlapped pattern in FIG. 2C is similar to the method of forming the semiconductor device illustrated in FIGS. 4A-4Z, except that 1) the nFET WFM 402/402a is formed before the pFET WFM 402/402b, and 2) referring to FIGS. 4G-4H, the mask 410 is formed to cover the overlapping portions of the pFET WFM 402/402b, resulting in the formation of the overlapping portion $202b_O$ and the overlapped portion $202a_O$.

Figure 6:
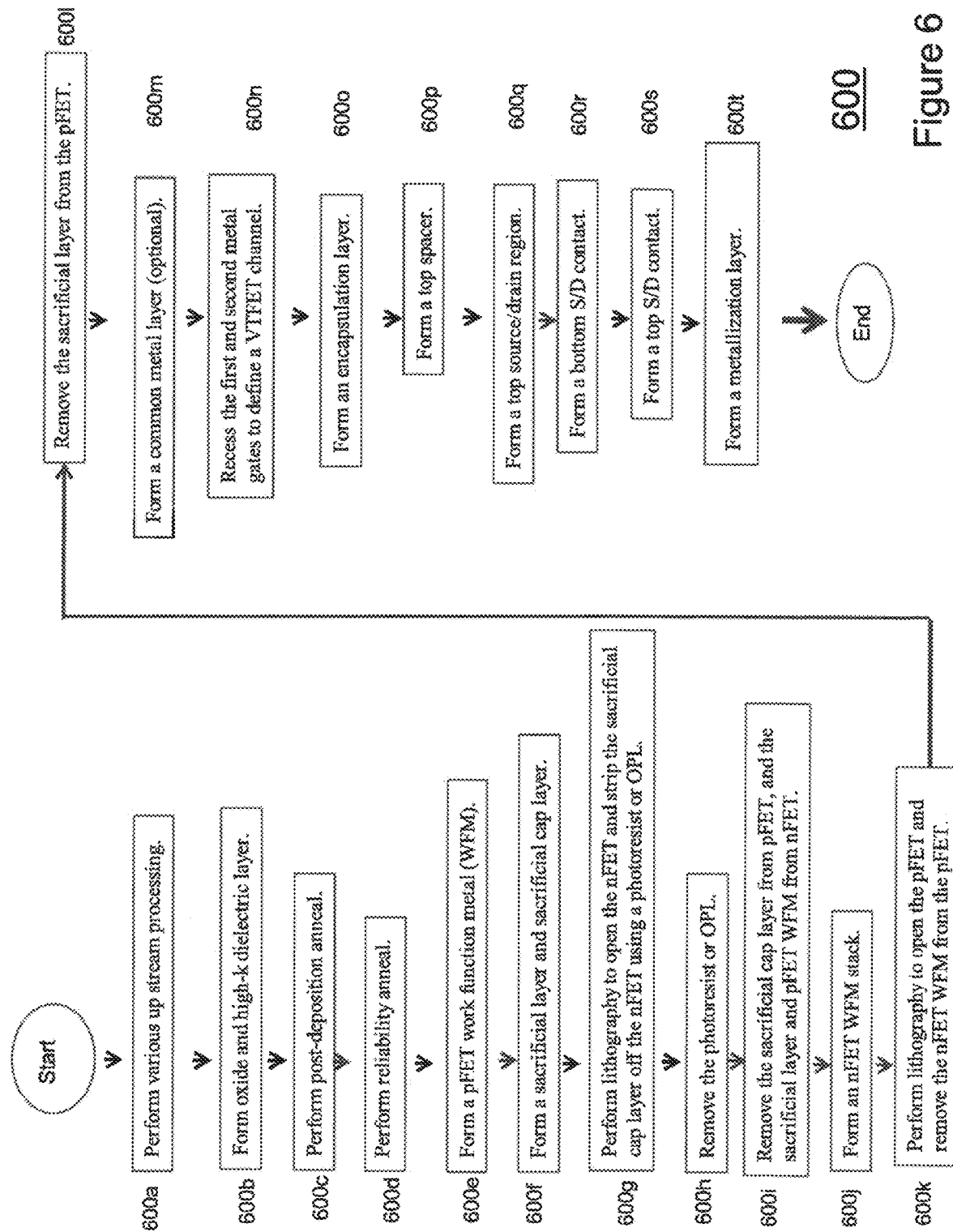
FIG. 6 is a flow chart for a method 600 of forming a semiconductor device having a pFET first pattern (underlapped or overlapped), according to another exemplary aspect of the present invention.

FIG. 6 is a flow chart for a method 600 of forming a semiconductor device having a pFET first pattern (underlapped or overlapped), according to another exemplary aspect of the present invention.

As illustrated in FIG. 6, the method 600 includes various up stream processing 600a (e.g., forming a bottom contact, bottom spacer (e.g., $SiO_2$, SiN), and nFET and pFET fins), forming (e.g., growing) 600b an oxide layer (e.g., $SiO_2$) and high-k dielectric layer (e.g., $HfO_2$), a post-deposition anneal 600c and reliability anneal 600d.

The method 600 also includes forming 600e a pFET work function metal (WFN) (e.g., TiN or a metal stack, etc.), forming 600f (e.g., by deposition) a sacrificial layer (e.g., amorphous-Si, SiGe, etc.) and sacrificial cap layer (e.g., TiN), performing lithography 600g to open the nFET and strip the sacrificial cap layer off the nFET using a photoresist or OPL, removing 600h the photoresist or OPL, removing 600i the sacrificial cap layer from the pFET, and the sacrificial layer and pFET WFM from the nFET, forming 600j (e.g., by deposition) an nFET WFM stack, performing lithography 600k to open the pFET and remove (e.g., strip) the nFET WFM from the pFET, and removing (e.g., stripping) 600l the sacrificial layer from the pFET.

The method 600 may also include forming 600m (e.g., by deposition) a common metal layer deposition. However, this may be optional. In particular, the forming 600m of the common metal layer may be utilized with an underlapped configuration in order to electrically connect the metal gates of the pFET and nFET (e.g., the first and second metal gates 202a, 202b in FIG. 2A).

The method 600 may also include recessing 600n the first and second metal gates to define a VTFET channel, forming 600o (e.g., by deposition) an encapsulation layer, forming 600p a top spacer, forming 600q (e.g., by epitaxial growth) a top source/drain region, forming 600r a bottom S/D contact, forming 600s a top S/D contact, and forming 600t a metallization layer (M1).

Again, it should be noted that the semiconductor device having an underlapped pattern (as opposed to an overlapped pattern) may have the same configuration regardless of whether the metal gate of the nFET (e.g., 402a) is formed first and the metal gate of the pFET (e.g., 402b) is formed second, or the metal gate of the pFET is formed first and the metal gate of the nFET is formed second. That is, the configuration of a semiconductor device having a pFET-first underlapped pattern may be the same as the configuration of a semiconductor device having an nFET-first underlapped pattern.

Figure 7A:
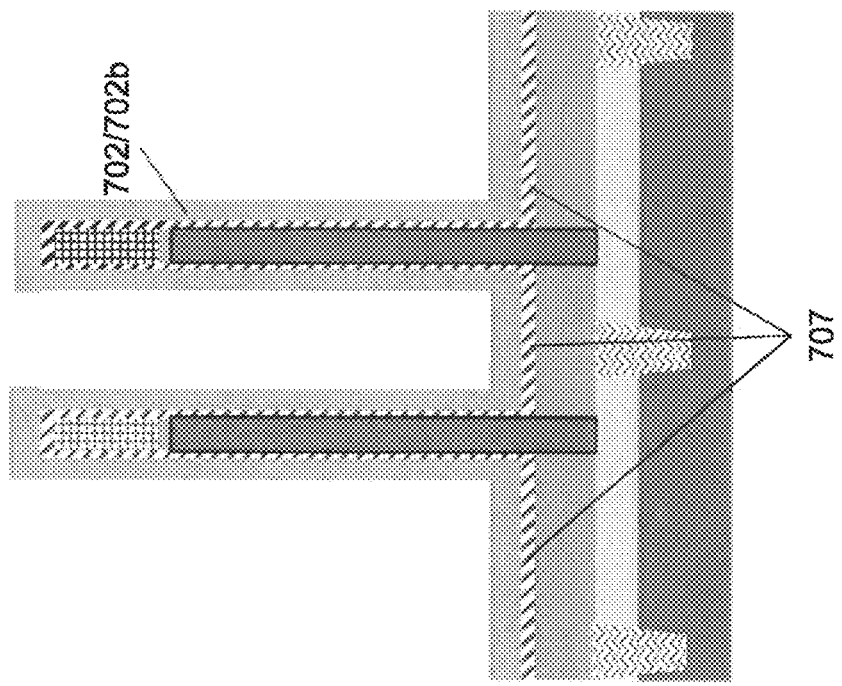

FIGS. 7A-7Z illustrate a method 700 of forming a semiconductor device with a pFET-first underlapped pattern, according to another exemplary aspect of the present invention.

In particular, FIG. 7A illustrates (e.g., after performing a reliability strip) the forming of a high-k dielectric layer 707 (e.g., $HfO_2$, etc.) on the bottom spacer 703 (e.g., $SiO_2$, SiN, etc.), the fins 701a, 701b, the oxide layer 719a, 719b (e.g., $SiO_2$), and the hard mask (e.g., SiN) 708a, 708b, according to an exemplary aspect of the present invention.

Figure 7B:
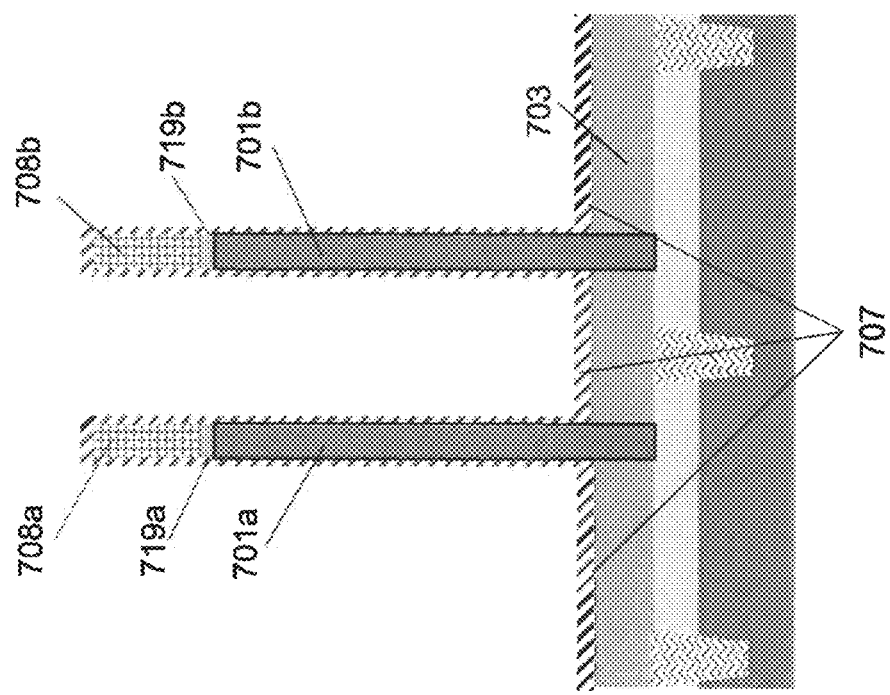
FIG. 7B illustrates the forming of the pFET WFM 702/702b (e.g., TiN) (e.g., which becomes the metal gate 702b of the pFET) on the high-k dielectric layer 707, according to an exemplary aspect of the present invention.

FIG. 7B illustrates the forming of the pFET WFM 702/702b (e.g., TiN) (e.g., which becomes the metal gate 702b of the pFET) on the high-k dielectric layer 707, according to an exemplary aspect of the present invention.

Figure 7D:
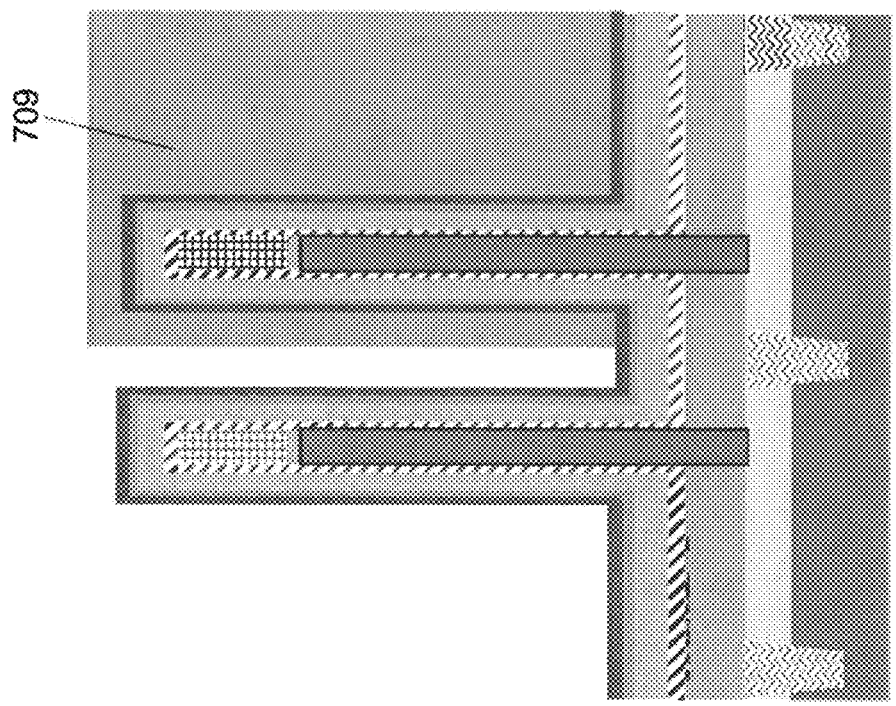
FIG. 7D illustrates the forming of a mask 709 (e.g., photoresist or OPL) on the pFET, according to an exemplary aspect of the present invention.
Figure 7C:
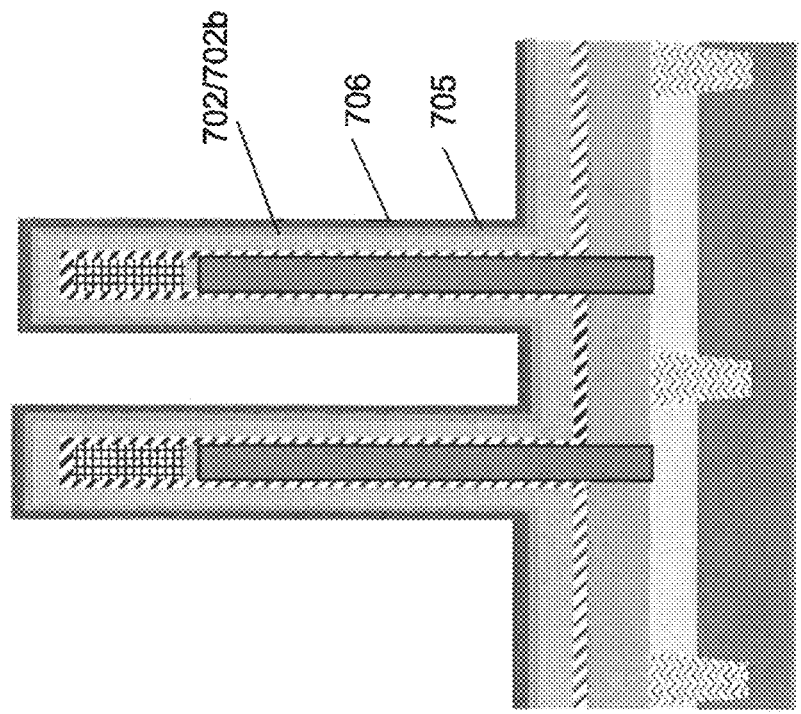
FIG. 7C illustrates the forming of the sacrificial layer 705 on the pFET WFM 702/702b, and the forming of the sacrificial cap layer 706 on the sacrificial layer 705, according to an exemplary aspect of the present invention.

FIG. 7C illustrates the forming of the sacrificial layer 705 on the pFET WFM 702/702b, and the forming of the sacrificial cap layer 706 on the sacrificial layer 705, according to an exemplary aspect of the present invention. It should be noted that the sacrificial layer 705 in this embodiment may be, for example, amorphous-Si or SiGe.

FIG. 7D illustrates the forming of a mask 709 (e.g., photoresist or OPL) on the pFET, according to an exemplary aspect of the present invention.

Figure 7F:
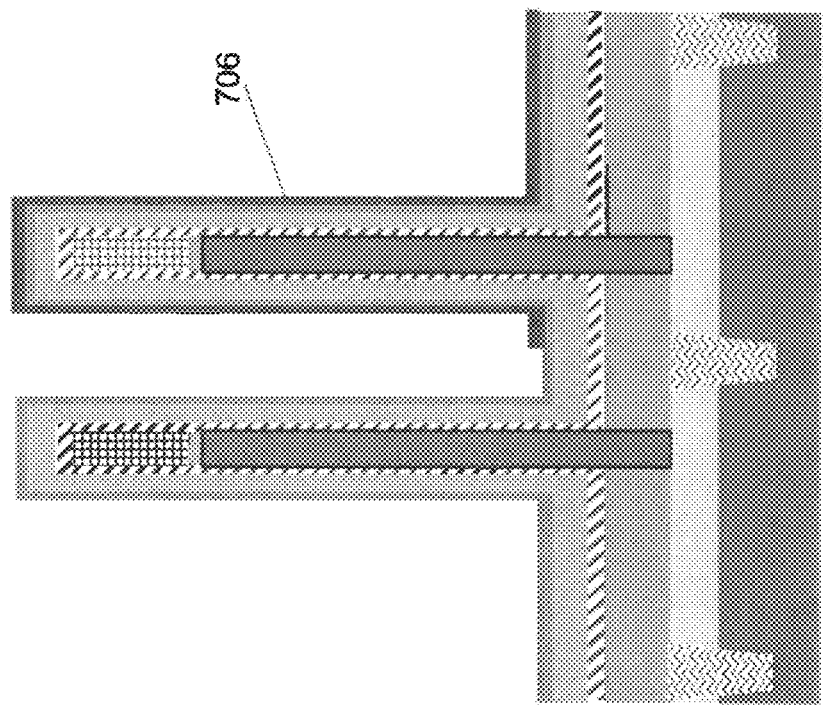
FIG. 7F illustrates the removing of the mask 709 to expose the sacrificial cap layer 706 on the pFET, according to an exemplary aspect of the present invention.
Figure 7E:
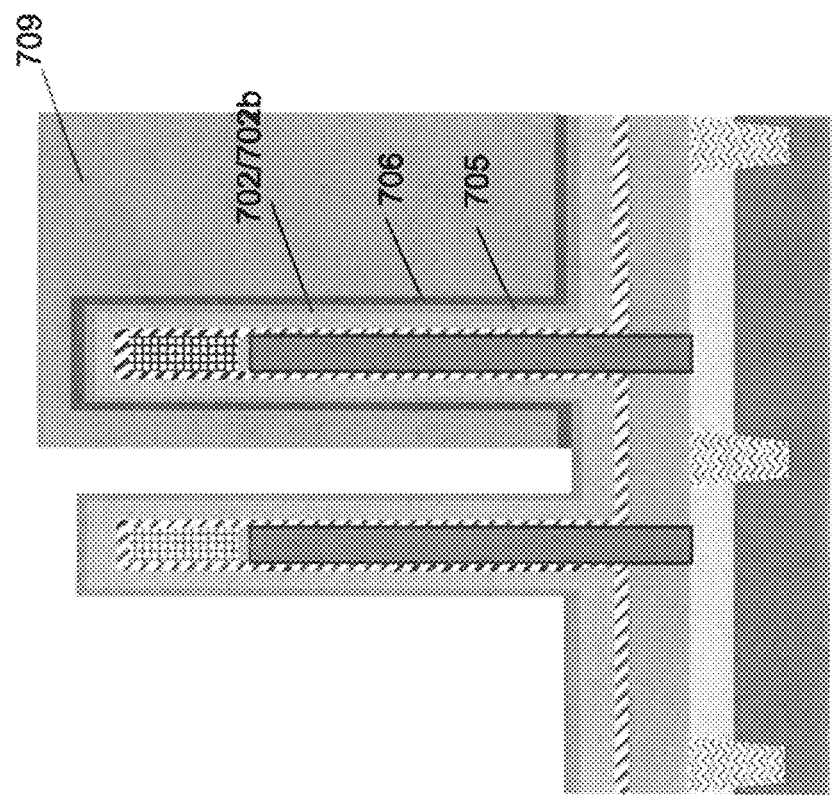
FIG. 7E illustrates the removing (e.g., stripping, etching away etc.) of the sacrificial cap layer 706 on the nFET, according to an exemplary aspect of the present invention.

FIG. 7E illustrates the removing (e.g., stripping, etching away etc.) of the sacrificial cap layer 706 on the nFET, according to an exemplary aspect of the present invention.

FIG. 7F illustrates the removing of the mask 709 to expose the sacrificial cap layer 706 on the pFET, according to an exemplary aspect of the present invention.

Figure 7H:
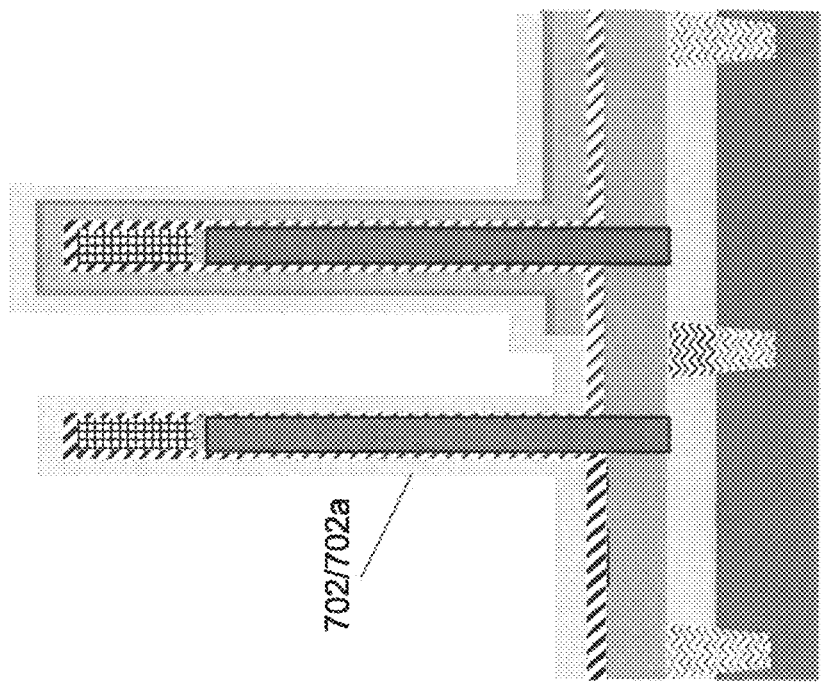
FIG. 7H illustrates the forming of the nFET WFM 702/702a on the nFET and pFET, according to an exemplary aspect of the present invention.
Figure 7G:
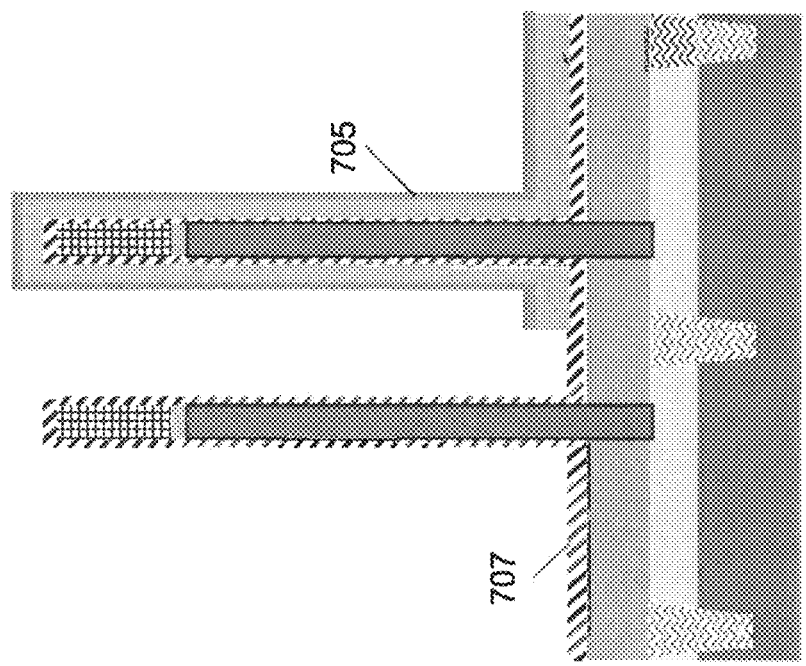
FIG. 7G illustrates the removing of the sacrificial cap layer 706 from the pFET to expose the sacrificial layer 705, and removing the sacrificial layer and pFET WFM from the nFET to expose the high-k dielectric layer 707, according to an exemplary aspect of the present invention.

FIG. 7G illustrates the removing of the sacrificial cap layer 706 from the pFET to expose the sacrificial layer 705, and removing the sacrificial layer and pFET WFM from the nFET to expose the high-k dielectric layer 707, according to an exemplary aspect of the present invention.

FIG. 7H illustrates the forming of the nFET WFM 702/702a on the nFET and pFET, according to an exemplary aspect of the present invention.

FIG. 7I illustrates the forming a mask 710 on the nFET, according to an exemplary aspect of the present invention.

FIG. 7J illustrates the removing (e.g., stripping, etching away etc.) of the nFET WFM 702/702a on the pFET, according to an exemplary aspect of the present invention. It should be noted that the nFET WFM 702/702a may be etched so as to form the gap G between the metal gates 702a, 702b.

Figure 7K:
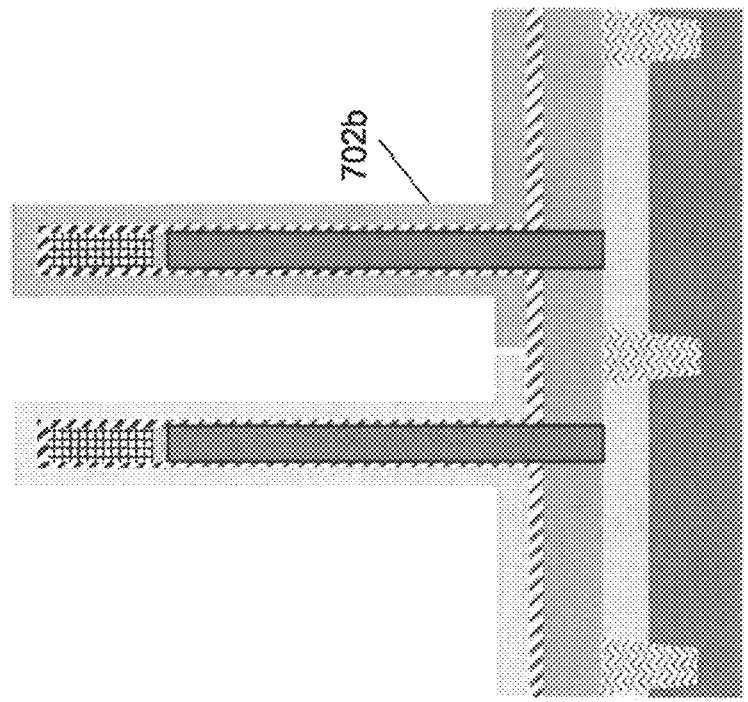
FIG. 7K illustrates the removing of the mask 710 to expose the metal gate 702a (e.g., after patterning), according to an exemplary aspect of the present invention.

FIG. 7K illustrates the removing of the mask 710 to expose the metal gate 702a (e.g., after patterning), according to an exemplary aspect of the present invention.

Figure 7L:
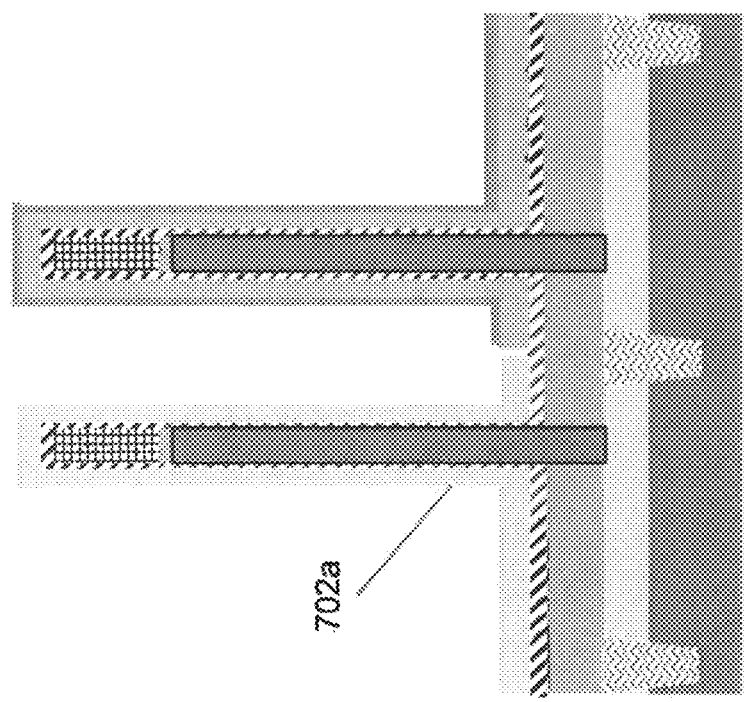
FIG. 7L illustrates the removing of the sacrificial layer 705 on the pFET to expose the metal gate 702b, according to an exemplary aspect of the present invention.

FIG. 7L illustrates the removing of the sacrificial layer 705 on the pFET to expose the metal gate 702b, according to an exemplary aspect of the present invention.

Figure 7N:
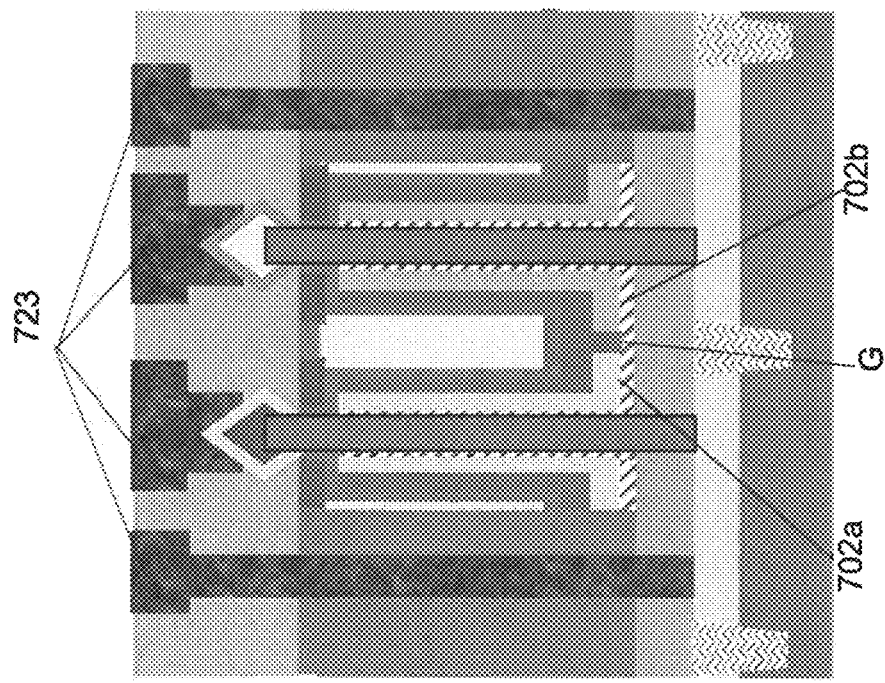
FIG. 7N illustrates the device formed by the method 700 after formation of the contacts 723, according to an exemplary aspect of the present invention.
Figure 7M:
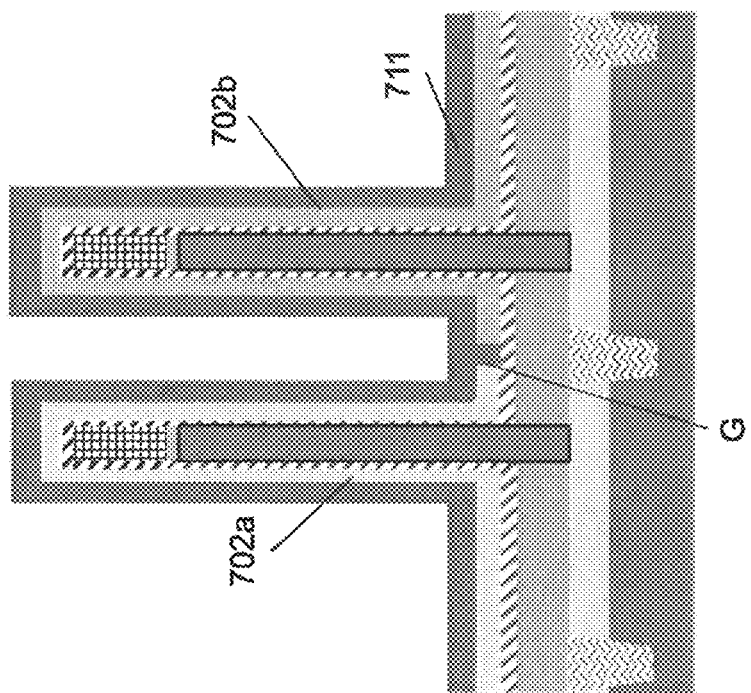
FIG. 7M illustrates the forming of a common metal layer 711 on the nFET and pFET, and inside the gap according to an exemplary aspect of the present invention.

FIG. 7M illustrates the forming of a common metal layer 711 on the nFET and pFET, and inside the gap according to an exemplary aspect of the present invention. The common metal layer 411 may be a pure metal layer or an alloy compound or a metal stack which can be used a conductor. The material could be, but not limited to, TiN and W. A thickness of the common metal layer 711 may be in a range from 2 nm to 10 nm. However, the thickness of the common metal layer 711 in the gap G may be greater then (e.g., twice or more) the thickness of the common metal layer 711 on the upper surface of the metal gates 702a, 702b.

FIG. 7N illustrates the device formed by the method 700 after formation of the contacts 723, according to an exemplary aspect of the present invention. It should be noted that a structure of the device formed by the method 700 may be substantially the same as the structure of the device 200a illustrated in FIG. 2A.

FIG. 7O illustrates a semiconductor device 750 having a pFET-first, overlapped pattern, according to an exemplary aspect of the present invention. The semiconductor device 750 may be formed by a method similar to the method 700 illustrated in FIGS. 7A-7N. However, to form the semiconductor device 750, referring to FIGS. 7I-7J, the mask 710 is formed to cover the overlapping portions of the nFET WFM 702/702a, resulting in the formation of the overlapping portion 702a_O and the overlapped portion 702b_O.

That is, a configuration of the semiconductor device 750 is similar to a configuration of the semiconductor device in FIG. 7N. However, in the semiconductor device 750, there is no gap G formed between the first and second metal gates 702a, 702b. Instead, the second metal gate 702b is formed first (i.e., pFET first), and then the first metal gate 702a is formed on the second metal gate 702b, so that a portion 702a$_O$ of the first metal gate 702a "overlaps" a portion 702b$_O$ of the second metal gate 702b.

As also illustrated in FIG. 7O, the semiconductor device 750 may include a remnant 705$_S$ of a sacrificial layer 705 (e.g., amorphous-Si or SiGe etc) which are utilized in forming the semiconductor device 750. This remnants 705$_S$ may remain on the second metal gate 702b and therefore, between the overlapping portion 702a$_O$ and the overlapped portion 702b$_O$.

FIG. 8 is a flow chart for a method 800 of forming a semiconductor device having an nFET first pattern (underlapped or overlapped), according to another exemplary aspect of the present invention.

As illustrated in FIG. 8, the method 800 includes various up stream processing 800a (e.g., forming a bottom contact, bottom spacer (e.g., SiO$_2$, SiN), and nFET and pFET fins), forming (e.g., growing) 800b an oxide layer (e.g., SiO$_2$) and high-k dielectric layer (e.g., HfO$_2$), a post-deposition anneal 800c and reliability anneal 800d.

The method 800 also includes forming 800e an nFET WFM stack, forming 800f (e.g., by deposition) a sacrificial layer (e.g., amorphous-Si, SiGe, etc.) and sacrificial cap layer (e.g., TiN or oxide), performing lithography 800g to open the pFET and strip the sacrificial cap layer off the pFET using a photoresist or OPL, removing 800h the photoresist or OPL, removing 800i the sacrificial cap layer from the nFET, and the sacrificial layer and nFET WFM from the pFET, forming 800j (e.g., by deposition) a pFET WFM stack (e.g., TiN, metal stack, etc.), performing lithography 800k to open the nFET and remove (e.g., strip) the pFET WFM from the nFET, and removing (e.g., stripping) 800l the sacrificial layer from the nFET.

The method 800 may also include forming 800m (e.g., by deposition) a common metal layer deposition. However, this may be optional. In particular, the forming 800m of the common metal layer may be utilized with an underlapped configuration in order to electrically connect the metal gates of the pFET and nFET (e.g., the first and second metal gates 202a, 202b in FIG. 2A).

The method 800 may also include recessing 800n the first and second metal gates to define a VTFET channel, forming 800o (e.g., by deposition) an encapsulation layer, forming 800p a top spacer, forming 800q (e.g., by epitaxial growth) a top source/drain region, forming 800r a bottom S/D contact, forming 800s a top S/D contact, and forming 800t a metallization layer (M1).

As noted above, the configuration of a semiconductor device having a pFET-first underlapped pattern may be the same as the configuration of a semiconductor device having an nFET-first underlapped pattern. Therefore, semiconductor device having an nFET-first underlapped pattern formed by the method 800 would have the same configuration as the semiconductor device illustrated in FIG. 7N.

Figure 9:
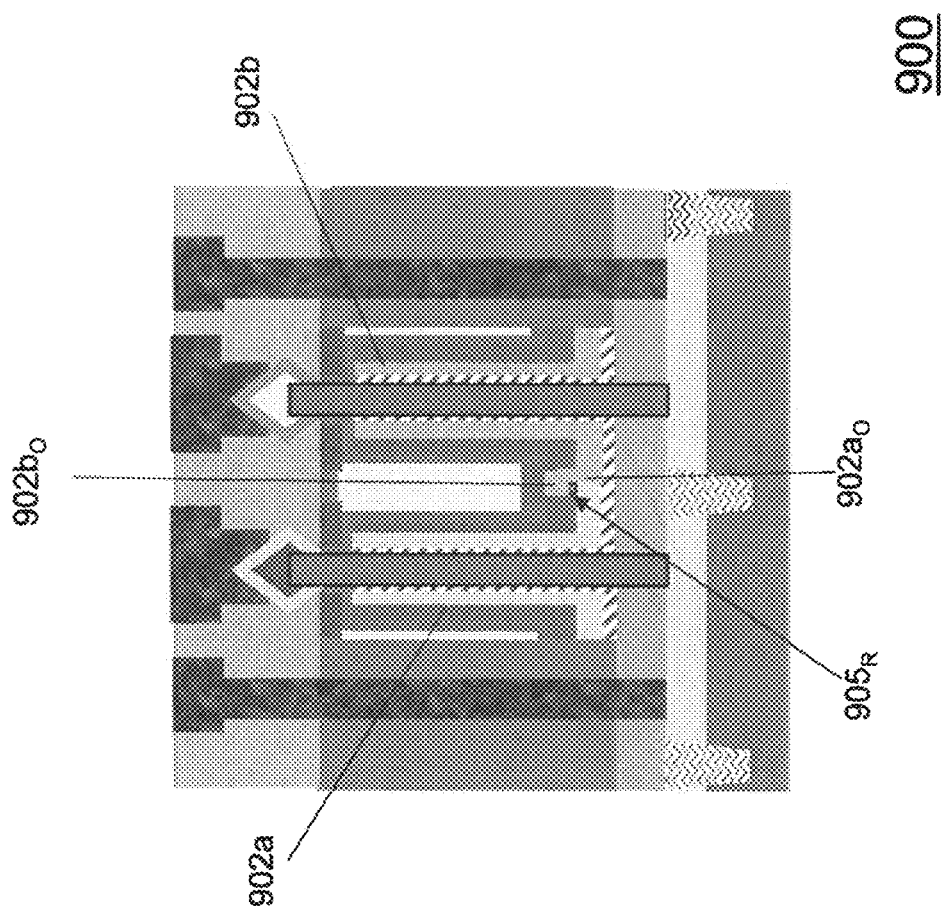
FIG. 9 illustrates a semiconductor device 700 having an nFET-first, overlapped pattern, according to an exemplary aspect of the present invention.

FIG. 9 illustrates a semiconductor device 700 having an nFET-first, overlapped pattern, according to an exemplary aspect of the present invention.

The semiconductor device 900 may be formed by a method similar to the method 700 illustrated in FIGS. 7A-7N. However, to form the semiconductor device 900 the nFET WFM 702/702a would be formed before the pFET WFM 702/702b (e.g., as described in the flowchart of FIG. 8). In addition, referring to FIGS. 7I-7J, to form the semiconductor device 900, the mask 710 would formed to cover the overlapping portions of the pFET WFM 702/702b, resulting in the formation of the overlapping portion 702b$_O$ of the metal gate 702b and the overlapped portion 702a$_O$ of the metal gate 702a.

That is, a configuration of the semiconductor device 900 is similar to a configuration of the semiconductor device in FIG. 7N. However, in the semiconductor device 900, there is no gap G formed between the first and second metal gates 902a, 902b. Instead, the second metal gate 902b is formed first (i.e., pFET first), and then the first metal gate 902a is formed on the second metal gate 902b, so that a portion 902a$_O$ of the first metal gate 902a "overlaps" a portion 902b$_O$ of the second metal gate 902b.

As also illustrated in FIG. 9, the semiconductor device 900 may include a remnant 905$_R$ of a sacrificial layer (e.g., amorphous-Si or SiGe etc) (e.g., sacrificial layer 705) which is utilized in forming the semiconductor device 900. This remnant 905$_R$ may remain on the second metal gate 902b and therefore, between the overlapping portion 902b$_O$ and the overlapped portion 902a$_O$.

Figure 10:
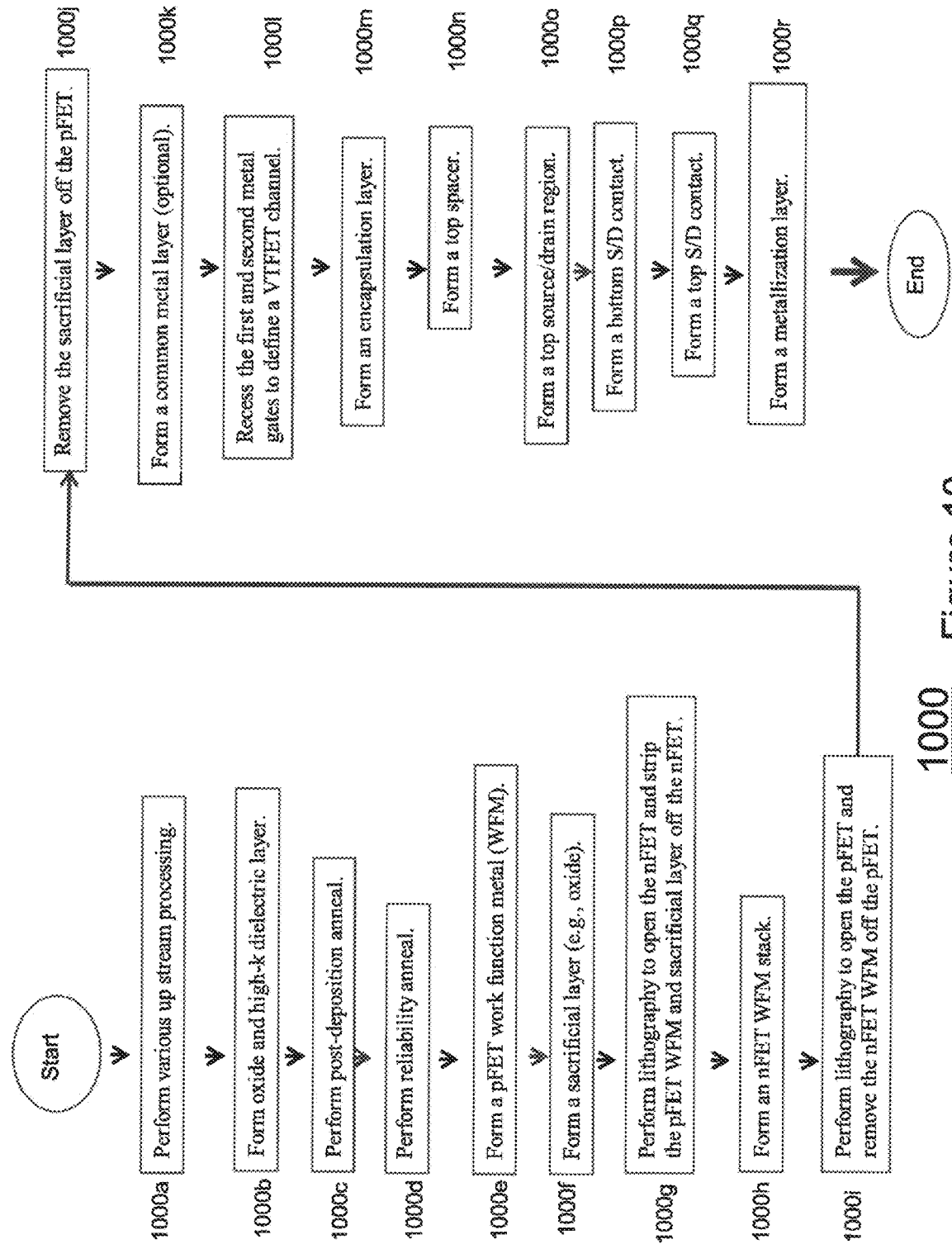
FIG. 10 is a flow chart for a method 1000 of forming a semiconductor device having a pFET first pattern (underlapped or overlapped), according to another exemplary aspect of the present invention.

FIG. 10 is a flow chart for a method 1000 of forming a semiconductor device having a pFET first pattern (underlapped or overlapped), according to another exemplary aspect of the present invention.

As illustrated in FIG. 10, the method 1000 includes various up stream processing 1000a (e.g., forming a bottom contact, bottom spacer (e.g., SiO$_2$, SiN), and nFET and pFET fins), forming (e.g., growing) 1000b an oxide layer (e.g., SiO$_2$) and high-k dielectric layer (e.g., HfO$_2$), a post-deposition anneal 1000c and reliability anneal 1000d.

The method 1000 also includes forming 1000e a pFET work function metal (WFM) (e.g., TiN or a metal stack, etc.), forming 1000f (e.g., by deposition) a sacrificial layer (e.g., oxide). It should be noted that no sacrificial cap layer is utilized in the method 1000.

The method 1000 also includes performing lithography 1000g to open the nFET and strip the pFET WFM and sacrificial layer off the nFET, forming 1000h (e.g., by deposition) an nFET WFM stack, performing lithography 1000i to open the pFET and remove (e.g., strip) the nFET WFM and sacrificial cap layer off the pFET, and removing (e.g., stripping) 1000j the sacrificial layer off the pFET.

The method 1000 may also include forming 1000k (e.g., by deposition) a common metal layer deposition. However, this may be optional. In particular, the forming 1000k of the common metal layer may be utilized with an underlapped configuration in order to electrically connect the metal gates of the pFET and nFET (e.g., first and second metal gates 202a, 202b (e.g., see FIG. 2A)).

The method 1000 may also include recessing 1000l the first and second metal gates to define a VTFET channel, forming 1000m (e.g., by deposition) an encapsulation layer, forming 1000n a top spacer, forming 1000o (e.g., by epitaxial growth) a top source/drain region, forming 1000p a bottom S/D contact, forming 1000q a top S/D contact, and forming 1000r a metallization layer (M1).

The method 1000 may be used to form a semiconductor device having an underlapped pattern (i.e., where a gap (e.g., gap G in FIG. 2A) is formed between the metal gate of the nFET and the metal gate of the pFET). In that case, the semiconductor device would have a configuration which is similar to the configuration of the semiconductor device illustrated in FIGS. 2A, 4Z and 7N.

Alternatively, the method 1000 may be used to form a semiconductor device having a pFET-first overlapped pattern. In that case, the semiconductor device would have a configuration which is similar to the configuration of the semiconductor device illustrated in FIG. 7O except that the remaining material is oxide instead of a-Si or SiGe.

Figure 11:
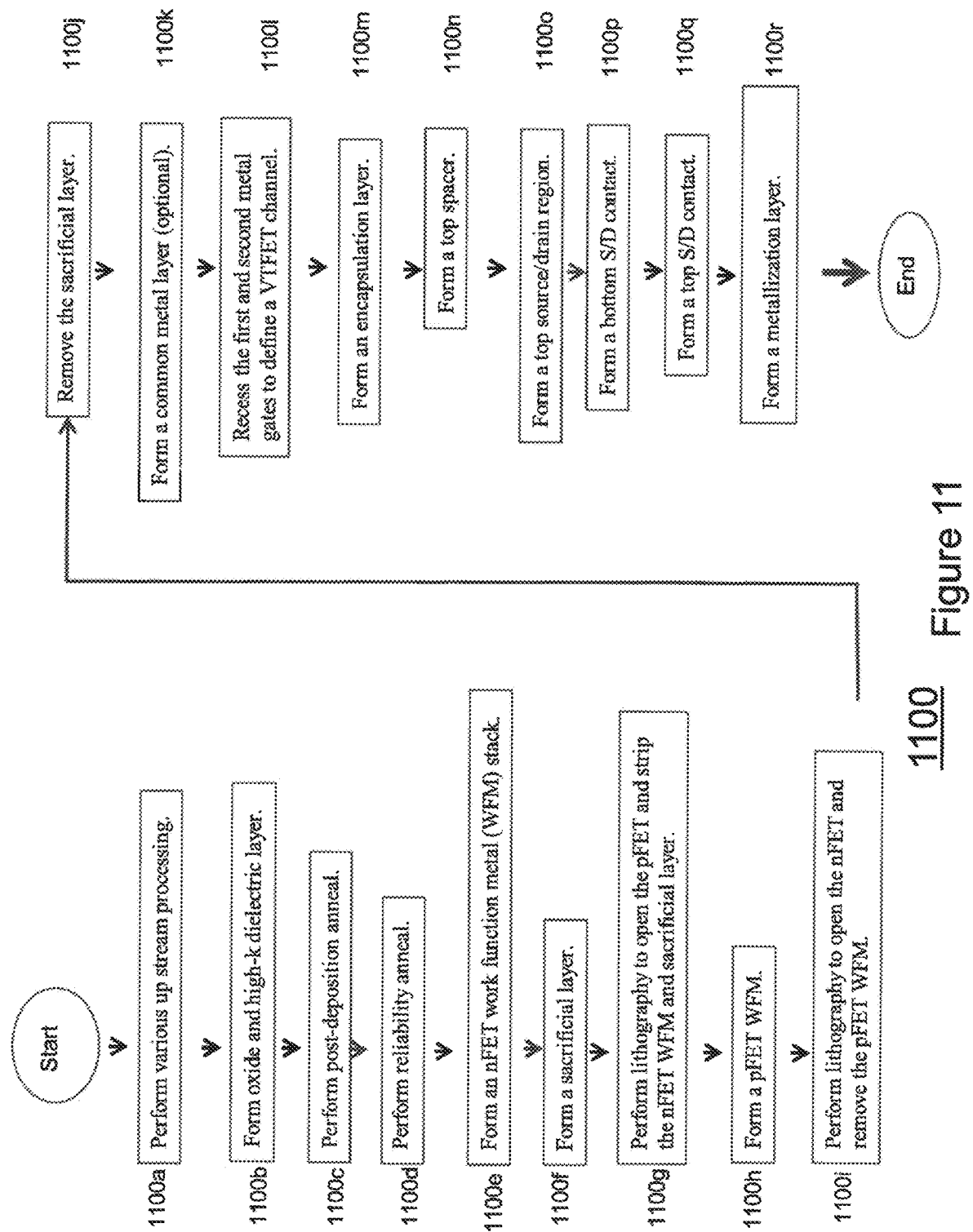
FIG. 11 is a flow chart for a method 1100 of forming a semiconductor device having nFET first pattern (underlapped or overlapped), according to another exemplary aspect of the present invention.

FIG. 11 is a flow chart for a method 1100 of forming a semiconductor device having nFET first pattern (underlapped or overlapped), according to another exemplary aspect of the present invention.

As illustrated in FIG. 11, the method 1100 includes various up stream processing 1100a (e.g., forming a bottom contact, bottom spacer (e.g., SiO$_2$, SiN), and nFET and pFET fins), forming (e.g., growing) 1100b an oxide layer (e.g., SiO$_2$) and high-k dielectric layer (e.g., HfO$_2$), a post-deposition anneal 1100c and reliability anneal 1100d.

The method 1100 also includes forming 1100e an nFET WFM stack, and forming 1100f (e.g., by deposition) a sacrificial layer (e.g., oxide).). It should be noted that no sacrificial cap layer is utilized in the method 1100.

The method 1100 also includes performing lithography 1100g to open the pFET and strip the nFET WFM and sacrificial layer off the pFET, forming 1100h (e.g., by deposition) a pFET WFM (e.g., TiN or a metal stack, etc.), performing lithography 1100i to open the nFET and remove (e.g., strip) the pFET WFM off the nFET, and removing (e.g., stripping) 1100j the sacrificial layer The method 1100 may also include forming 1100k (e.g., by deposition) a common metal layer deposition. However, this may be optional. In particular, the forming 1100k of the common metal layer may be utilized with an underlapped configuration in order to electrically connect the first and second metal gates 202a, 202b (e.g., see FIG. 2A).

The method 1100 may also include recessing 1100l the first and second metal gates to define a VTFET channel, forming 1100m (e.g., by deposition) an encapsulation layer, forming 1100n a top spacer, forming 1100o (e.g., by epitaxial growth) a top source/drain region, forming 1100p a bottom S/D contact, forming 1100q a top S/D contact, and forming 1100r a metallization layer (M1).

The method 1100 may be used to form a semiconductor device having an underlapped pattern (i.e., where a gap (e.g., gap G in FIG. 2A) is formed between the metal gate of the nFET and the metal gate of the pFET). In that case, the semiconductor device would have a configuration which is similar to the configuration of the semiconductor device illustrated in FIGS. 2A, 4Z and 7N.

Alternatively, the method 1100 may be used to form a semiconductor device having an nFET-first overlapped pattern. In that case, the semiconductor device would have a configuration which is similar to the configuration of the semiconductor device illustrated in FIG. 7O except that the remaining material is oxide instead of a-Si or SiGe.

With its unique and novel features, the exemplary aspects of the present invention may provide a semiconductor device in which a thickness of a metal gate of an nFET (e.g., metal gate 202a) is substantially the same as a thickness of a metal gate of the pFET (e.g., metal gate 202b).

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A semiconductor device, comprising:
    an n-type field effect transistor (nFET) including a first fin and a first metal gate formed on the first fin; and
    a p-type field effect transistor (pFET) including a second fin and a second metal gate formed on the second fin, a thickness of the second metal gate being substantially the same as a thickness of the first metal gate,
    wherein a portion of one of the first and second metal gates overlaps a portion of the other of the first and second metal gates.

2. The semiconductor device of claim 1, wherein the first metal gate comprises a material which is different from a material of the second metal gate.

3. The semiconductor device of claim 1, further comprising:
    a high-k dielectric layer between the first metal gate and the first fin of the nFET, and between the second metal gate and the second fin of the pFET.

4. The semiconductor device of claim 1, further comprising:
    a common metal layer formed on the first metal gate of the nFET and the second metal gate of the pFET.

5. The semiconductor device of claim 1, wherein the common metal layer electrically connects the first metal gate of the nFET and the second metal gate of the pFET.

6. The semiconductor device of claim 4, wherein the common metal layer is formed in a gap between the first metal gate of the nFET and the second metal gate of the pFET.

7. The semiconductor device of claim 6, wherein a width of the gap is less than 60 nm.

8. The semiconductor device of claim 1, wherein the portion of the one of the first and second metal gates overlaps the portion of the other of the first and second metal gates at a location between the first and second fins.

9. The semiconductor device of claim 1, wherein a length of the overlapped portion of the other of the first and second metal gates is less than 60 nm.

10. A method of forming a semiconductor device, comprising:
    forming an n-type field effect transistor (nFET) including a first fin and a first metal gate formed on the first fin; and
    forming a p-type field effect transistor (pFET) including a second fin and a second metal gate formed on the second fin, a thickness of the second metal gate being substantially the same as a thickness of the first metal gate,
    wherein a portion of one of the first and second metal gates overlaps a portion of the other of the first and second metal gates.

11. The method of claim 10, wherein the first metal gate comprises a material which is different from a material of the second metal gate.

12. The method of claim 10, further comprising:
    a high-k dielectric layer between the first metal gate and the first fin of the nFET, and between the second metal gate and the second fin of the pFET.

13. The method of claim 10, further comprising:
    a common metal layer formed on the first metal gate of the nFET and the second metal gate of the pFET.

14. The method of claim 13, wherein the common metal layer electrically connects the first metal gate of the nFET and the second metal gate of the pFET.

15. The method of claim 14, wherein the common metal layer is formed in a gap between the first metal gate of the nFET and the second metal gate of the pFET.

16. The method of claim 15, wherein a width of the gap is less than 60 nm.

17. The method of claim 10, wherein a portion of one of the first and second metal gates overlaps a portion of the other of the first and second metal gates.

18. The method of claim 17, wherein a length of the overlapped portion of the other of the first and second metal gates is less than 60 nm.

19. A semiconductor device, comprising:
- an n-type field effect transistor (nFET) including a first fin and a first metal gate formed on the first fin;
- a p-type field effect transistor (pFET) including a second fin and a second metal gate formed on the second fin, a thickness of the second metal gate being substantially the same as a thickness of the first metal gate, the first metal gate comprising a material which is different from a material of the second metal gate; and
- a high-k dielectric layer between the first metal gate and the first fin of the nFET, and between the second metal gate and the second fin of the pFET,
- wherein a portion of one of the first and second metal gates overlaps a portion of the other of the first and second metal gates.

20. The semiconductor device of claim 19, further comprising:
- a common metal layer formed on the first metal gate of the nFET and the second metal gate of the pFET, and in a gap between the first metal gate of the nFET and the second metal gate of the pFET, the common metal layer electrically connecting the first metal gate of the nFET and the second metal gate of the pFET.

\* \* \* \* \*